United States Patent
Miyahara

(10) Patent No.: US 10,679,969 B2
(45) Date of Patent: Jun. 9, 2020

(54) ELECTRONIC CIRCUIT DEVICE AND METHOD FOR MANUFACTURING ELECTRONIC CIRCUIT DEVICE

(71) Applicant: FUJITSU LIMITED, Kawasaki-shi, Kanagawa (JP)

(72) Inventor: Shoichi Miyahara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/902,275

(22) Filed: Feb. 22, 2018

(65) Prior Publication Data

US 2018/0247917 A1    Aug. 30, 2018

(30) Foreign Application Priority Data

Feb. 28, 2017    (JP) .................. 2017-037145

(51) Int. Cl.
*H01L 25/065*    (2006.01)
*H01L 25/00*    (2006.01)
(Continued)

(52) U.S. Cl.
CPC .......... *H01L 25/0657* (2013.01); *H01L 24/16* (2013.01); *H01L 24/81* (2013.01); *H01L 25/50* (2013.01); *H01L 25/18* (2013.01); *H01L 2224/13025* (2013.01); *H01L 2224/16013* (2013.01); *H01L 2224/16014* (2013.01); *H01L 2224/16148* (2013.01);
(Continued)

(58) Field of Classification Search
CPC ..... H01L 25/0657; H01L 24/16; H01L 24/81; H01L 25/50; H01L 2224/16014; H01L 2224/16013; H01L 2224/81193; H01L 2924/1432; H01L 2224/81125; H01L 2225/06513; H01L 2225/06593; H01L 25/18; H01L 2224/81127; H01L 2924/1434; H01L 2224/16148
See application file for complete search history.

(56) References Cited

U.S. PATENT DOCUMENTS 7,579,848 B2 *  8/2009  Bottoms .............. G01R 1/0483
                                               324/756.03
9,136,204 B2 *  9/2015  Ide ........................ H01L 23/481
(Continued)

FOREIGN PATENT DOCUMENTS

JP    2004-079905    3/2004
JP    2007-158237    6/2007
JP    2011-065733    3/2011

*Primary Examiner* — Marcos D. Pizarro
*Assistant Examiner* — Sue Tang
(74) *Attorney, Agent, or Firm* — Fujitsu Patent Center

(57) ABSTRACT

An electronic circuit device includes a first electronic component having a set of first terminals disposed at a first pitch on a first surface, and a second electronic component having a set of second terminals disposed at a second pitch on a second surface facing the first surface of the first electronic component. The second pitch of the second terminals is set larger than the first pitch of the first terminals. By doing so, each of the second terminals is connected to at least one of the first terminals if a positional misalignment occurs. As a result, the electronic circuit device has an increased tolerance for positional misalignment between the first electronic component and the second electronic component and reduces the occurrence of connection failure.

8 Claims, 21 Drawing Sheets

(51) Int. Cl.
*H01L 23/00* (2006.01)
*H01L 25/18* (2006.01)
(52) U.S. Cl.
CPC .............. *H01L 2224/81125* (2013.01); *H01L 2224/81127* (2013.01); *H01L 2224/81193* (2013.01); *H01L 2225/06513* (2013.01); *H01L 2225/06541* (2013.01); *H01L 2225/06593* (2013.01); *H01L 2924/1432* (2013.01); *H01L 2924/1434* (2013.01)

(56) References Cited

U.S. PATENT DOCUMENTS

2007/0132085 A1\* 6/2007 Shibata .................... G11C 5/04
257/686
2011/0069523 A1 3/2011 Kuroda \* cited by examiner

16 TERMINALS

16 TERMINALS

ELECTRONIC CIRCUIT DEVICE AND METHOD FOR MANUFACTURING ELECTRONIC CIRCUIT DEVICE

CROSS-REFERENCE TO RELATED APPLICATION

This application is based upon and claims the benefit of priority of the prior Japanese Patent Application No. 2017-037145, filed on Feb. 28, 2017, the entire contents of which are incorporated herein by reference.

FIELD

The embodiments discussed herein relate to an electronic circuit device and a method for manufacturing an electronic circuit device.

BACKGROUND

To connect a semiconductor element and a circuit substrate, to connect semiconductor elements, or to connect other electronic components, the following technique is known: electronic components to be connected are arranged such that their surfaces on which terminals are disposed face each other, and the terminals are connected to each other. For this technique, the following practice is known: alignment marks are given to the electronic components, the electronic components are positioned by aligning the alignment marks by the use of a mounting apparatus, and then the terminals are connected to each other. The mounting apparatus includes a holder for holding electronic components, a stage for positioning the electronic components, a camera for detecting alignment marks, and others.

Please see, for example, Japanese Laid-open Patent Publication No. 2004-079905.

If a positional misalignment occurs between the electronic components due to spatial accuracy of the camera for image recognition, mechanical accuracy of the stage, or other reasons when the terminals of the electronic components are connected to each other, the risk of connection failure, such as non-connection or unintended connection between the terminals, increases.

SUMMARY

According to one aspect, there is provided an electronic circuit device including: a first electronic component including a first surface and a set of first terminals disposed at a first pitch on the first surface; and a second electronic component including a second surface facing the first surface, and a set of second terminals disposed at a second pitch on the second surface, the second pitch being larger than the first pitch, the set of second terminals each being connected to at least one of the first terminals.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

An example of a technique for connecting electronic components will be described.

The development and advancement in photolithography technology contribute to reducing wire width for semiconductor elements, such as Large-Scale Integration (LSI) chips. The reduction of the wire width causes attempts to reduce space for transistors and to reduce operating voltage. As a result, high-density assembly, fast-speed processing, and low power consumption of semiconductor elements are achieved.

By the way, to form a connection between electronic components, like a flip chip connection between a semiconductor element and a circuit substrate or another semiconductor element, the following technique is known: the surfaces of the electronic components on which terminals are disposed are arranged to face each other, and then the terminals are connected to each other.

With the photolithography technology, the plane sizes (radius) of terminals of electronic components may be reduced down to several tens nm to several hundreds nm (e.g., several times to several ten times the minimum wire size in layers of semiconductor elements), for example. If the wire width is further reduced in the future, the plane sizes of terminals of electronic components may be further reduced.

It is possible to improve the performance of an electronic circuit device including electronic components by reducing the plane sizes of terminals, increasing the number of terminals, and implementing a high-density assembly of terminals for connecting the electronic components. For example, if terminals that are used in data transfer between electronic components are downsized and thereby the bus width for data transfer is increased to 100 times, the amount of data to be transferred at the same clock may be increased to 100 times accordingly. In addition, if a clock for data transfer between electronic components is reduced down to one-hundredth, the power consumption for inputs and outputs (IO) of the electronic components may be reduced while maintaining the same performance.

A problem that needs to be solved in connecting terminals of electronic components is how to achieve an accurate positional alignment between the electronic components.

Figure 1:
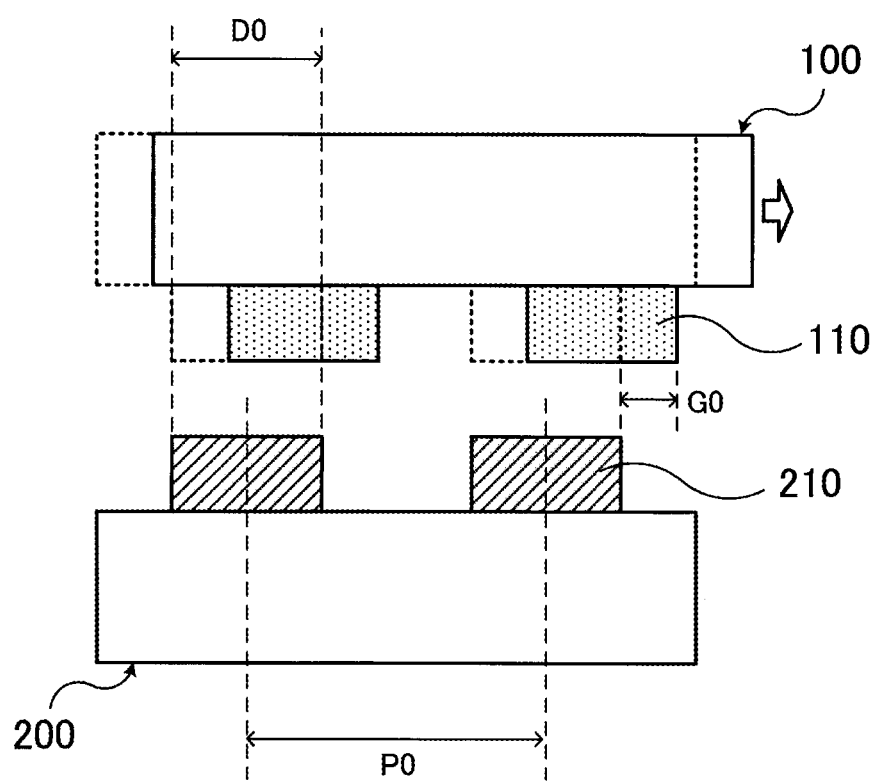
FIGS. 1 and 2 are views each for explaining a terminal connection between electronic components.
Figure 2:
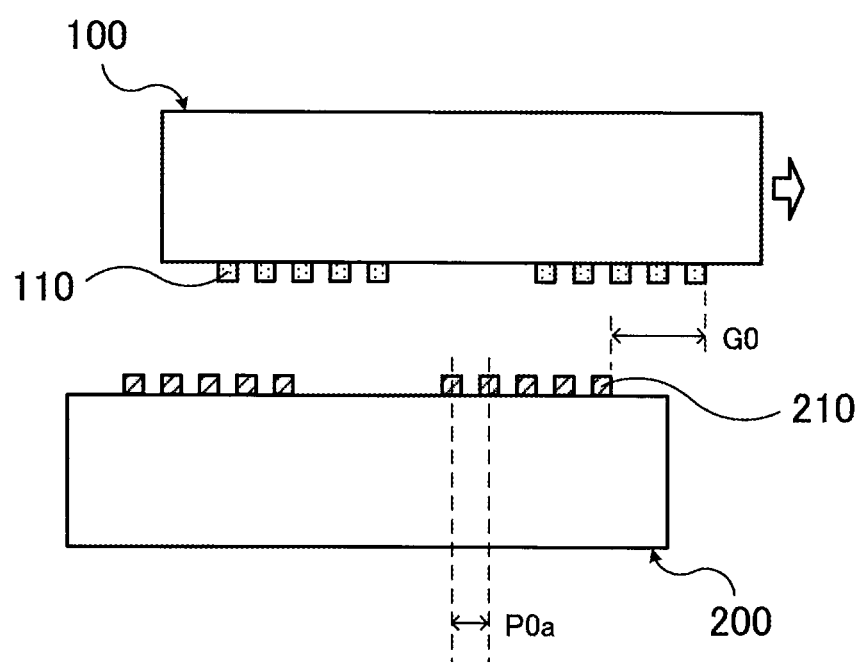

FIGS. 1 and 2 are views each for explaining a terminal connection between electronic components.

For example, a mounting apparatus is used to connect two electronic components to each other. The mounting apparatus includes a holder for holding and carrying one electronic component, a stage for adjusting the position of the other electronic component to be mounted on the one electronic component, a camera for detecting alignment marks given to the electronic components, and others. In this case, a positional misalignment of approximately 0.5 μm to several μm may occur between the electronic components due to spatial accuracy of the camera for image recognition and mechanical accuracy of the stage for adjusting the position of the other electronic component to be mounted.

To deal with this, for example, countermeasures as illustrated in FIG. 1 may be taken, expecting the positional misalignment that may be caused between the electronic components by the mounting apparatus. More specifically, terminals 110 and 210 of large plane size are formed on electronic components 100 and 200, respectively. By doing so, the terminals 110 and 210 are connected to each other if a positional misalignment G0 occurs. In the countermeasures, the lower limits on the plane size D0 and pitch P0 of the terminals 110 and 210 are constrained by the positional misalignment G0 that is expected to occur between the electronic components 100 and 200 due to the mounting apparatus.

By the way, the photolithography technology makes it possible to form small-size terminals 110 and 210 on the electronic components 100 and 200. As described earlier, a reduction in the plane size of the terminals 110 and 210 leads to increasing the number of terminals and implementing a high-density assembly of terminals for connecting the electronic components, thereby resulting in an improvement in the performance of an electronic circuit device. This is an advantage.

However, the use of the above-mentioned mounting apparatus for connecting the electronic components 100 and 200 with the terminals 110 and 210 that are small in plane size has the following problem. For example, if a positional misalignment G0 occurs between the electronic components 100 and 200 as illustrated in FIG. 2, due to the performance of the mounting apparatus, a positional misalignment between the terminals 110 and 210 to be connected may be several times as large as a pitch P0a.

If, even in the case where electronic components to be connected have terminals of small plane size, there is a terminal connection mechanism that provides positional misalignment tolerance to some extent in positional alignment between the electronic components, it would be possible to increase the number of terminals and improve the performance of an electronic circuit device.

In view of the foregoing points, mechanisms as will be described in the following embodiments are employed to increase tolerance for positional misalignment between electronic components to be connected.

Now, a first embodiment will be described.

Figure 3:
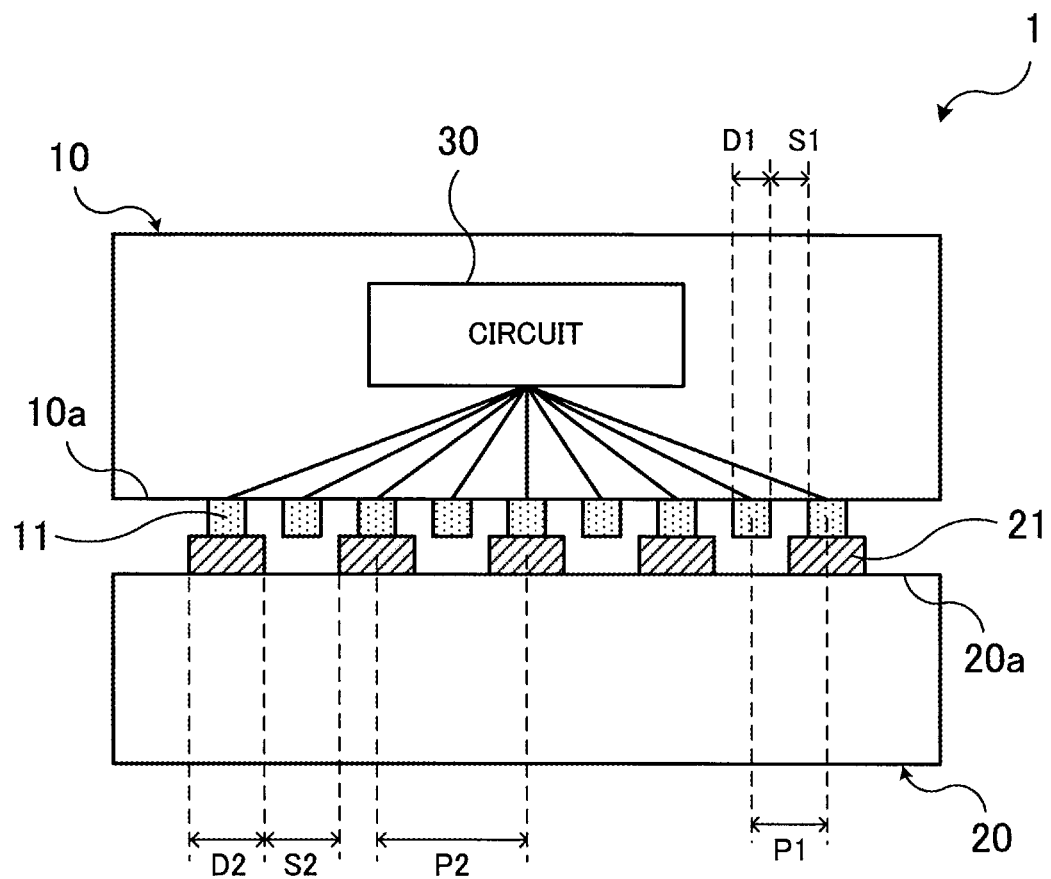
FIG. 3 illustrates an example of a structure of an electronic circuit device according to a first embodiment.

FIG. 3 illustrates an example of a structure of an electronic circuit device according to the first embodiment. FIG. 3 is a schematic cross-sectional view illustrating a main part of the example of the electronic circuit device.

The electronic circuit device 1 illustrated in FIG. 3 includes electronic components 10 and 20 that are arranged to face each other. The electronic component 10 has a set of terminals 11 on a surface 10a facing the electronic component 20. The electronic component 20 has a set of terminals 21 on a surface 20a facing the electronic component 10. These terminals 11 and terminals 21 may be electrode pads, or electrode pads with solder or another joint material applied to their surfaces, for example. Alternatively, the terminals 11 and terminals 21 may be pillars, pillars with solder or another joint material provided on their tips, or projecting electrodes such as solder bumps.

The terminals 11 of one electronic component 10 have a plane size (radius) D1 and a distance (space) S1 between adjacent terminals 11. In addition, the terminals 11 have a distance (pitch) P1 (=D1/2+D1/2+S1) between the centers of adjacent terminals 11. The terminals 21 of the other electronic component 20 have a plane size D2, a space S2 between adjacent terminals 21, and a pitch P2 (=D2/2+D2/2+S2) between adjacent terminals 21. The pitch p1 of the terminals 11 of the electronic component 10 is different from the pitch P2 of the terminals 21 of the electronic component 20.

In the example of FIG. 3, the pitch P1 of the terminals 11 of the electronic component 10 is smaller (narrower) than the pitch P2 of the terminals 21 of the electronic component 20. In this connection, in the example of FIG. 3, the plane size D1 of the terminals 11 of the electronic component 10 is different from and is smaller than the plane size D2 of the terminals 21 of the electronic component 20.

As described above, the terminals 21 are disposed at the pitch P2 on the electronic component 20, and the terminals 11 are disposed at the pitch P1 smaller than the pitch P2 on the electronic component 10. By doing so, if a positional misalignment occurs between the electronic components 10 and 20, each of the terminals 21 is connected to at least one of the terminals 11.

At least one of these electronic components 10 and 20, for example, the electronic component 10 is provided with a circuit 30 for setting one or more terminals 11 of the electronic component 10 as connection destinations (electrical connection destinations) for each terminal 21 of the electronic component 20. The circuit 30 determines which of the terminals 11 is to be set as an electrical connection destination for each of the terminals 21 after the electronic components 10 and 20 are arranged such that the surface 10a on which the terminals 11 are disposed and the surface 20a on which the terminals 21 are disposed face each other and then the electronic components 10 and 20 are physically connected to each other.

More specifically, a positional misalignment may occur when the electronic components 10 and 20 are connected to each other. If this occurs, connection relationship indicating which (one or more terminals) of the terminals 11 each terminal 21 is connected to varies according to the direction and amount of the positional misalignment because the pitch P1 of the terminals 11 is smaller than the pitch P2 of the terminals 21. To deal with this, the circuit 30 detects an electrical connection of each terminal 21 to one or more of the terminals 11, and sets the one or more terminals 11, for which the electrical connection is detected, as electrical connection destinations. At this time, the circuit 30 may assign a role, such as transmission of signals, transmission of power supply signals, or transmission of ground (GND) signals, to each combination of a terminal 21 and one or more terminals 11 set as its electrical connection destinations.

As described above, in the electronic circuit device 1, the set of terminals 11 are disposed at the pitch P1 on the electronic component 10 and the set of terminals 21 are disposed at the pitch P2 different from the pitch P1 on the electronic component 20. When the electronic components 10 and 20 are physically connected to each other, each of the terminals 21 is connected to at least one of the terminals 11. After the electronic components 10 and 20 are physically connected to each other, one or more of the terminals 11 are set as electrical connection destinations for each of the terminals 21. Even if a positional misalignment occurs when the electronic components 10 and 20 are physically connected to each other, in other words, even if each terminal 21 is physically connected to any one or more of the terminals 11, the connected one or more terminals 11 are set as the electrical connection destinations for the terminal 21 on the basis of the situation. Therefore, even if the electronic components 10 and 20 are connected to each other under a situation where a positional misalignment occurs, the electronic circuit device 1 that has prescribed functions is obtained. That is, it is possible to increase tolerance for positional misalignment between the electronic components 10 and 20 to be connected to each other.

A second embodiment will now be described.

A more specific example of the electronic circuit device 1 described in the above first embodiment will be described in the second embodiment.

Figure 4:
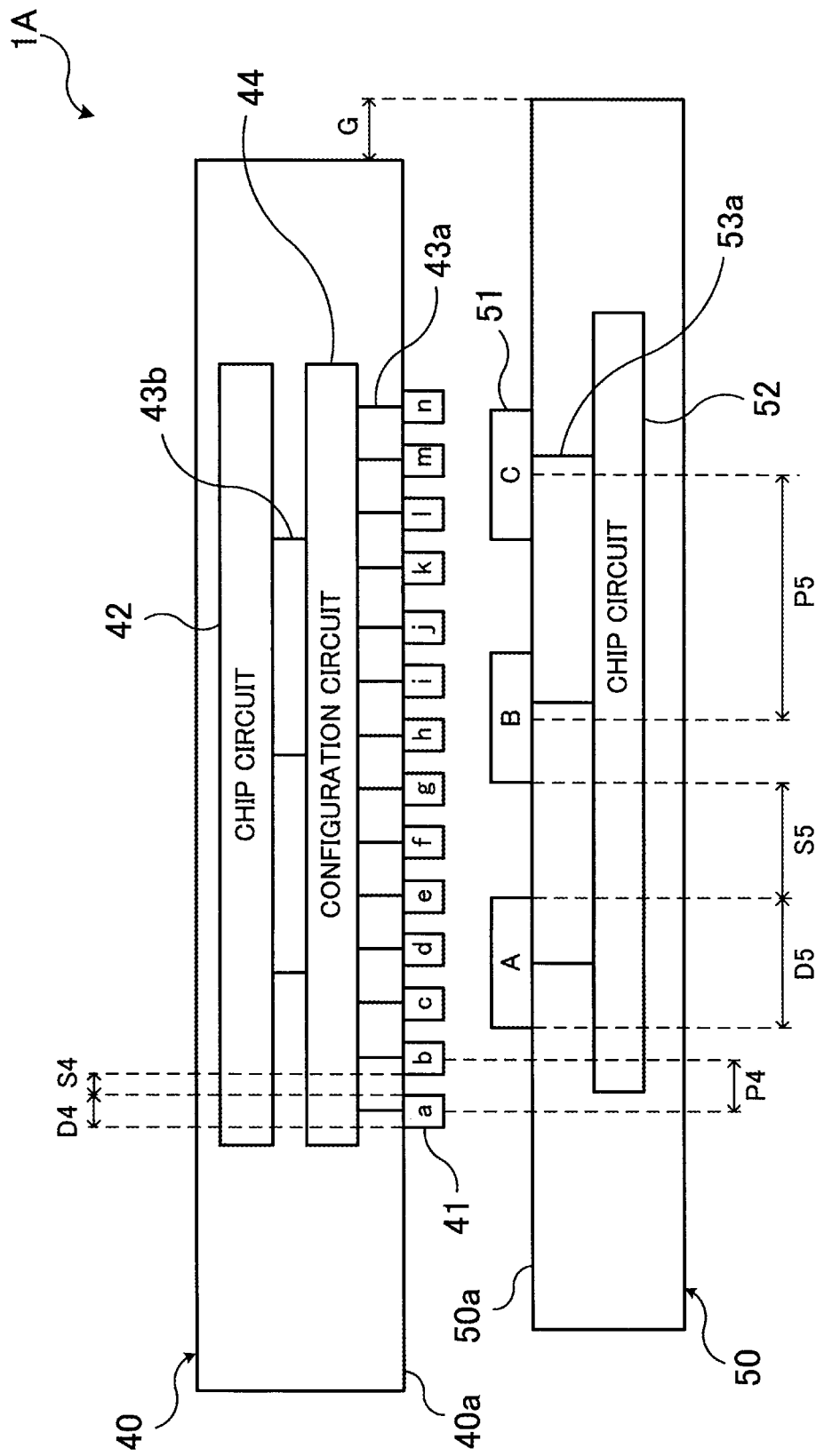
FIG. 4 illustrates an example of a structure of an electronic circuit device according to a second embodiment.

FIG. 4 illustrates an example of a structure of an electronic circuit device according to the second embodiment. In FIG. 4, terminals of an upper electronic component are separate from those of a lower electronic component for illustrative purposes only.

The electronic circuit device 1A illustrated in FIG. 4 includes a semiconductor chip 40 (semiconductor element) and a semiconductor chip 50 (semiconductor element) that are arranged to face each other vertically, as electronic components.

The upper semiconductor chip 40 has a set of terminals 41 (as an example, terminals a to n) on a surface 40a facing the lower semiconductor chip 50. The terminals 41 are electrode pads or electrode pads with solder or another joint material applied on their surfaces, for example. Alternatively, the terminals 41 may be pillars, pillars with solder or another joint material provided on their tips, or projecting electrodes such as solder bumps.

The terminals 41 of the semiconductor chip 40 have a plane size D4, a space S4 between adjacent terminals 41, and a pitch P4 (=D4/2+D4/2+S4) between adjacent terminals 41.

The semiconductor chip 40 further includes a circuit (chip circuit) 42 for implementing prescribed processing functions, and a circuit (configuration circuit) 44 for setting one or more of the terminals 41 as electrical connection destinations for each terminal 51 of the semiconductor chip 50. The chip circuit 42 is electrically connected to the configuration circuit 44 with a wire 43b. The configuration circuit 44 is electrically connected to each of the terminals 41 with a wire 43a.

The lower semiconductor chip 50 has a set of terminals 51 (as an example, terminals A to C) on a surface 50a facing the upper semiconductor chip 40. The terminals 51 are electrode pads or electrode pads with solder or another joint material applied on their surfaces, for example. Alternatively, the terminals 51 may be pillars, pillars with solder or another joint material provided on their tips, or projecting electrodes such as solder bumps.

The terminals 51 of the semiconductor chip 50 have a plane size D5, a space S5 between adjacent terminals 51, and a pitch P5 (=D5/2+D5/2+S5) between adjacent terminals 51. The pitch P5 of the terminals 51 of the semiconductor chip 50 is set wider than the pitch P4 of the terminals 41 of the semiconductor chip 40 (P4<P5). In this connection, in the example of FIG. 4, the plane size D5 of the terminals 51 of the semiconductor chip 50 is set larger than the plane size D4 of the terminals 41 of the semiconductor chip 40 (D4<D5).

The semiconductor chip 50 further includes a circuit (chip circuit) 52 for implementing prescribed processing functions. The chip circuit 52 is electrically connected to each of the terminals 51 with a wire 53a.

To connect the semiconductor chips 40 and 50 to each other, the semiconductor chips 40 and 50 are arranged such that the surface 40a having the terminals disposed thereon faces the surface 50a having the terminals 51 disposed thereon, and are subjected to positional alignment, heating, pressing, and other processes, thereby connecting the terminals 41 and the terminals 51 to each other.

In the electronic circuit device 1A, the terminals 41 of one semiconductor chip 40 are formed smaller in plane size and space (D4<D5 and S4<S5) and narrower in pitch (P4<P5) than the terminals 51 of the other semiconductor chip 50. If a positional misalignment G occurs in the positional alignment that is performed in connecting the semiconductor chips 40 and 50, each of the terminals 51 having the comparatively wide pitch (wide pitch) P5 is connected to at least one of the terminals 41 having the comparatively narrow pitch (narrow pitch) P4.

The configuration circuit 44 built in the semiconductor chip 40 is designed to set one or more of the terminals 41 as electrical connection destinations for each terminal 51 of the semiconductor chip 50. The configuration circuit 44 detects one or more terminals 41 (for example, terminals c, d, and e) that are electrically connected to each terminal 51 (for example, terminal A) of the semiconductor chip 50 after the semiconductor chips 40 and 50 are physically connected to each other. Then, the configuration circuit 44 connects the one or more terminals 41 detected as being electrically connected to the terminal 51, to the chip circuit 42.

The configuration circuit 44 will now be described.

Figure 5:
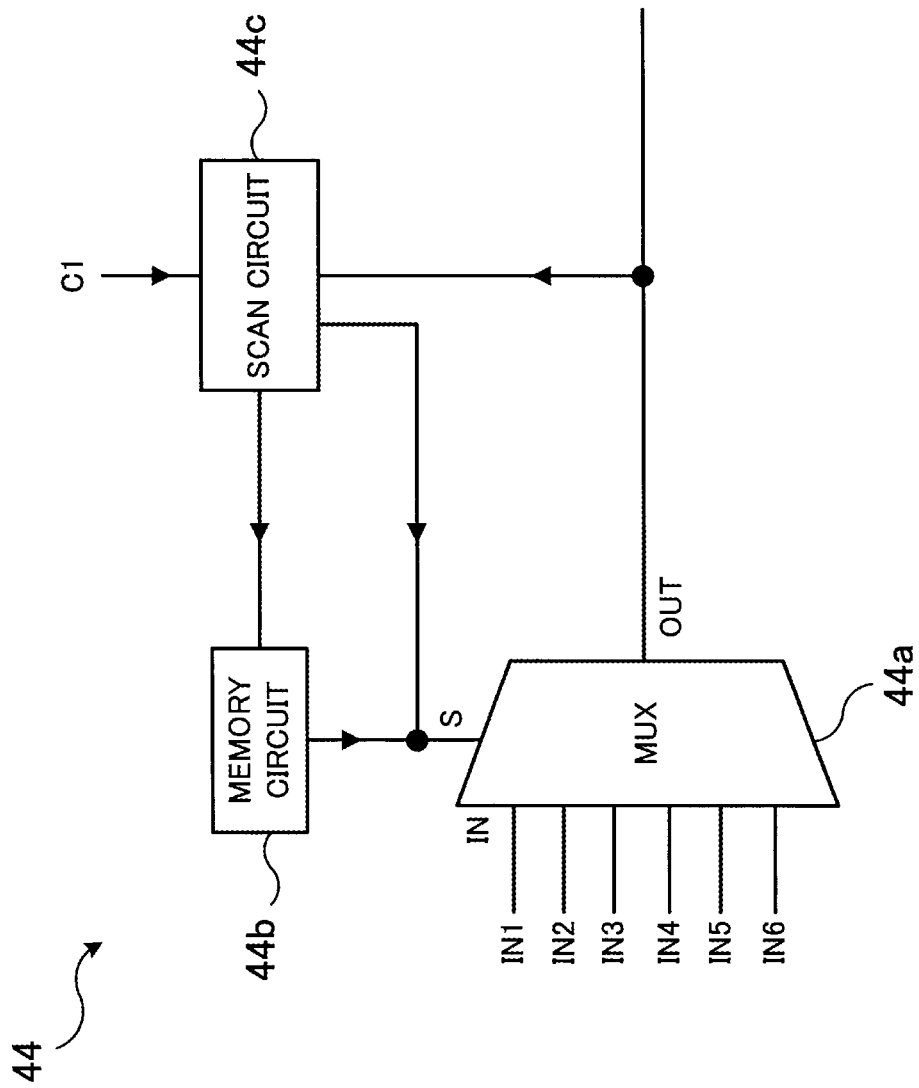
FIG. 5 illustrates an example of a structure of a configuration circuit.

FIG. 5 illustrates an example of a structure of the configuration circuit 44.

For example, the configuration circuit 44 includes a multiplexer (MUX) 44a, a memory circuit 44b, and a scan circuit 44c, as illustrated in FIG. 5.

The multiplexer 44a is a kind of selector circuit, and connects any of input pins IN (IN1 to IN6) to an output pin OUT according to an input signal S. The memory circuit 44b is connected to the multiplexer 44a. The scan circuit 44c controls the input signal S to be input to the multiplexer 44a according to a control signal C1, monitors an output of the output pin OUT, and writes information indicating an input pin IN that is connected to the output pin OUT when a prescribed output is detected, in the memory circuit 44b.

When the electronic circuit device 1A including the semiconductor chip 40 with the configuration circuit 44 built therein and the semiconductor chip 50 connected to the semiconductor chip 40 actually operates, the multiplexer 44a connects one or more input pins IN to the output pin OUT with reference to the settings written in the memory circuit 44b connected to the multiplexer 44a.

Figure 6:
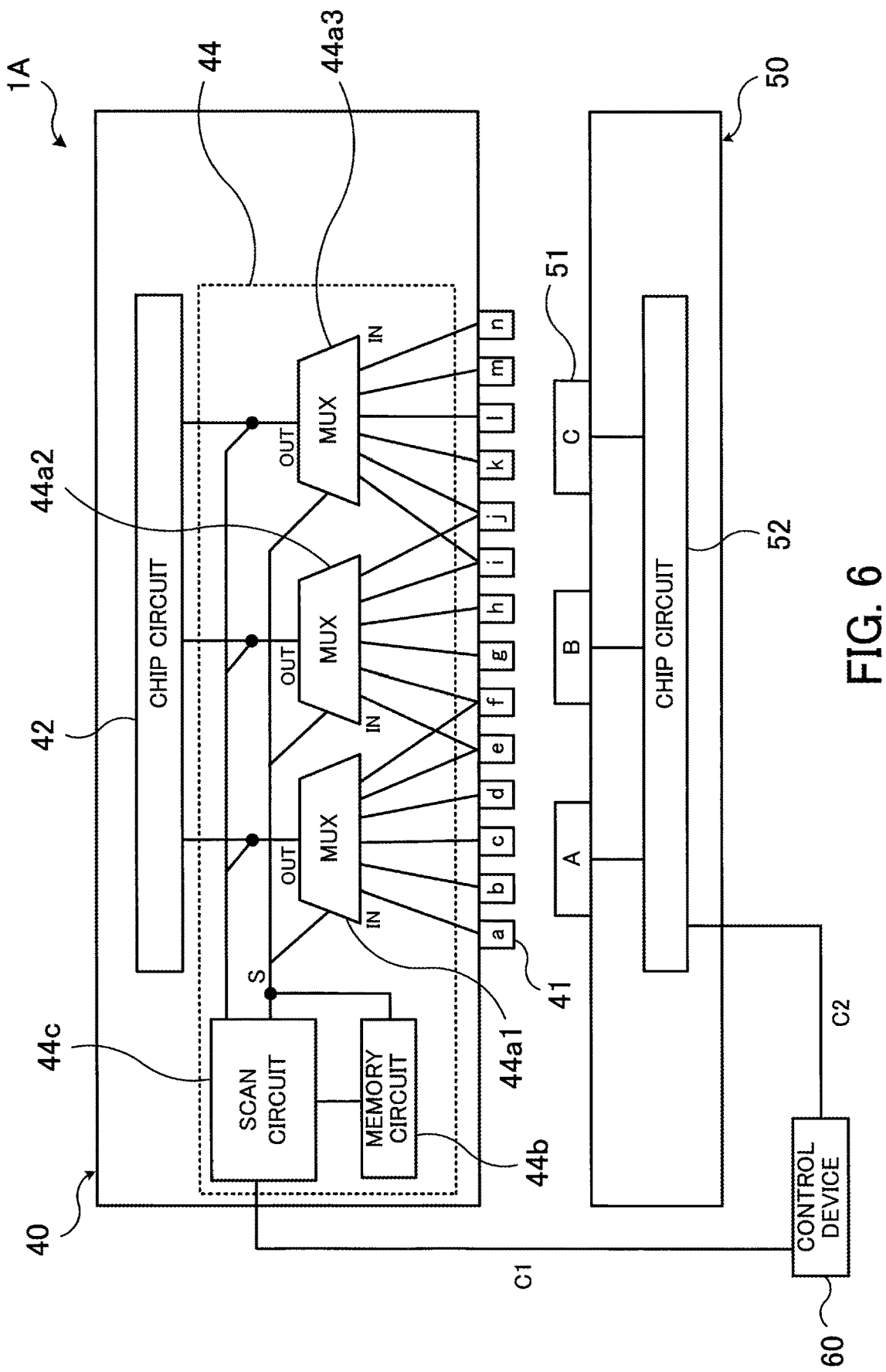
FIG. 6 illustrates an example of a structure of an electronic circuit device using the configuration circuit.
Figure 7:
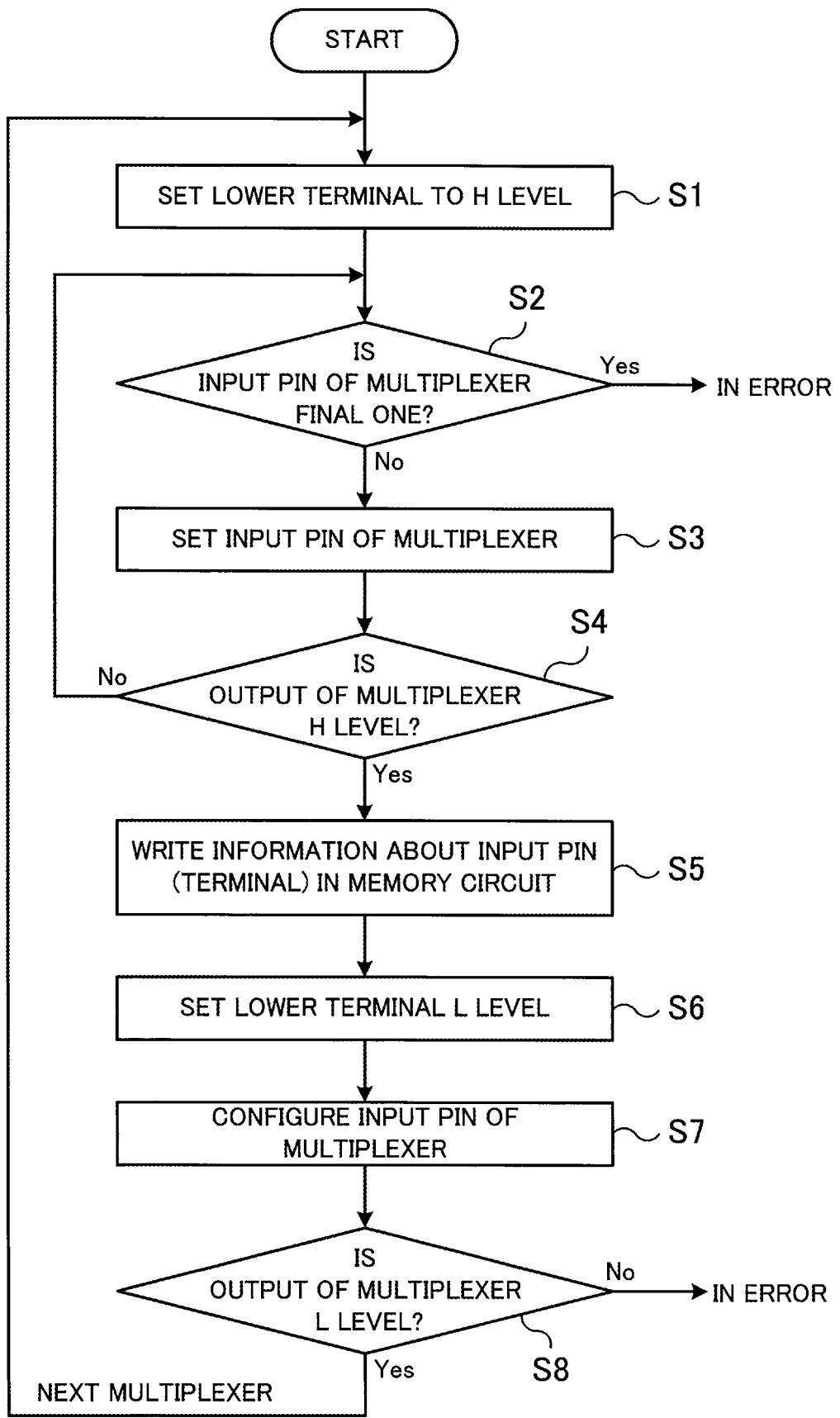
FIG. 7 illustrates an example of a processing flow of setting electrical connection destinations for terminals.

FIG. 6 illustrates an example of a structure of the electronic circuit device 1A using the above configuration circuit 44, and FIG. 7 illustrates an example of a processing flow of setting electrical connection destinations for terminals in the electronic circuit device 1A. In this connection, in FIG. 6, the set of upper terminals 41 is separate from the set of lower terminals 51 for illustrative purposes only.

For example, as illustrated in FIG. 6, the configuration circuit 44 built in the upper semiconductor chip 40 includes three multiplexers 44a1, 44a2, and 44a3.

Input pins IN of the multiplexer (MUX) 44a1 are respectively connected to six terminals a to f (terminals 41) of the semiconductor chip 40, which are candidates to be connected to the terminal A (terminal 51) of the semiconductor chip 50. Input pins IN of the multiplexer (MUX) 44a2 are respectively connected to six terminals e to j (terminals 41) of the semiconductor chip 40, which are candidates to be connected to the terminal B (terminal 51) of the semiconductor chip 50. Input pins IN of the multiplexer 44a3 (MUX) are respectively connected to six terminals i to n (terminals 41) of the semiconductor chip 40, which are candidates to be connected to the terminal C (terminal 51) of the semiconductor chip 50. For example, among the terminals a to n, the candidate terminals to be connected to each terminal A to C are determined based on positional misalignment that is expected to occur when the semiconductor chips 40 and 50 are physically connected to each other.

The scan circuit 44c inputs an input signal S to each of these three multiplexers 44a1, 44a2, and 44a3, and monitors outputs of their output pins OUT. The scan circuit 44c receives a control signal C1 from an external control device 60. The scan circuit 44c controls the input signal S to be input to each multiplexer 44a1, 44a2, and 44a3 on the basis of the control signal C1 received from the control device 60.

In the lower semiconductor chip 50, a chip circuit 52 receives a control signal C2 from the external control device 60, and sets each of the terminals A to C to a prescribed state (logical High (H) level, Low (L) level, High-Z state, or the like).

In this connection, a computer including a processor, a memory, and others is used as the control device 60. In this connection, the computer is entirely controlled by the processor, and performs prescribed processing functions of the control device 60 by the processor running programs stored in the memory, for example.

After the semiconductor chips 40 and 50 are physically connected to each other, the configuration circuit 44 performs the process illustrated in FIG. 7 to set one or more of the terminals a to n as electrical connection destinations for each of the terminals A to C, for example.

First, the control device 60 supplies a control signal C2 to the chip circuit 52 of the lower semiconductor chip 50 in order to set only the terminal A of the terminals A to C (terminals 51) to H level and set the terminals B and C to L level (step S1 in FIG. 7).

Then, the control device 60 supplies a control signal C1 to the scan circuit 44c built in the upper semiconductor chip 40 to cause the scan circuit 44c to scan the first multiplexer 44a1 (steps S2 to S5 in FIG. 7).

To this end, the scan circuit 44c supplies an input signal S for the multiplexer 44a1 to the input pin IN connected to the first terminal a (terminal 41) (steps S2 and S3 in FIG. 7), and determines whether an output from the output pin OUT is H level (step S4 in FIG. 7). If the output is determined to be H level in step S4, the scan circuit 44c writes information indicating the input pin IN connected to the output pin OUT at this time point, that is, information indicating the terminal a, in the memory circuit 44b (step S5 in FIG. 7). If the output is not determined to be H level in step S4, the scan circuit 44c supplies the input signal S for the multiplexer 44a1 to the input pin IN connected to the second terminal b (steps S2 and S3 in FIG. 7), and after that, steps S2 to S5 are repeated in the same manner. In this way, the scan circuit 44c scans the input pins IN (terminals a to f) of the multiplexer 44a1 until the scan circuit 44c detects an output of H level. If the scan circuit 44c does not detect an output of H level as a result of scanning all the input pins IN of the multiplexer 44a1, the electronic circuit device 1A is determined to be in error (step S2 in FIG. 7).

In the case where the scan circuit 44c detects an output of H level in connection with any of the input pins IN of the multiplexer 44a1, the control device 60 supplies a control signal C2 to the semiconductor chip 50 in order to set only the terminal A of the terminals A to C (terminals 51) to L level and set the terminals B and C to H level (step S6 in FIG. 7).

Then, the control device 60 supplies a control signal C1 to the scan circuit 44c to cause the scan circuit 44c to confirm the setting of the multiplexer 44a1 (steps S7 and S8 in FIG. 7).

To this end, the scan circuit 44c configures the input pin IN connected to the output pin OUT from which an output of H level has been detected by the scanning of steps S2 to S5, as an input pin IN connected to the output pin OUT of the multiplexer 44a1 (step S7 in FIG. 7). Then, the scan circuit 44c determines whether an output from the output pin OUT is L level (step S8 in FIG. 7). When an output of L level is detected at step S8, the setting for the first multiplexer 44a1 is completed, and steps S1 to S8 are executed for the second multiplexer 44a2 in the same manner. If an output of L level is not detected at step S8, this electronic circuit device 1A is determined to be in error (step S8 in FIG. 7).

If the electronic circuit device 1A is determined to be in error (steps S2 and S8 in FIG. 7), the physical connection between the semiconductor chips 40 and 50 is done over again, and steps S1 to S8 are repeated. Alternatively, the electronic circuit device 1A determined to be in error may be discarded.

The control device 60 executes steps S1 to S8 on all the multiplexers 44a1, 44a2, and 44a3 included in the semiconductor chip 40 in the above-described manner. As a result, the electronic circuit device 1A in which input pins IN (terminals a to n (terminals 41)) are set as electrical connection destinations for the terminals A to C (terminal 51) of the semiconductor chip 50 is obtained.

When the electronic circuit device 1A actually operates, information written in the memory circuit 44b as a result of executing steps S1 to S8 is read, and the input pins IN indicated in the read information are connected to the appropriate output pins OUT of the multiplexers 44a1, 44a2, and 44a3. That is to say, the terminals 41 connected to the input pins IN are connected to the chip circuit 42. Thereby, the chip circuit 52 of the semiconductor chip 50 and the chip circuit 42 of the semiconductor chip 40 are electrically connected to each other via the terminals 51 and the terminals 41 (connected to the respective terminals 51), and electrical signals are transferred between the chip circuit 52 and the chip circuit 42.

Figure 8:
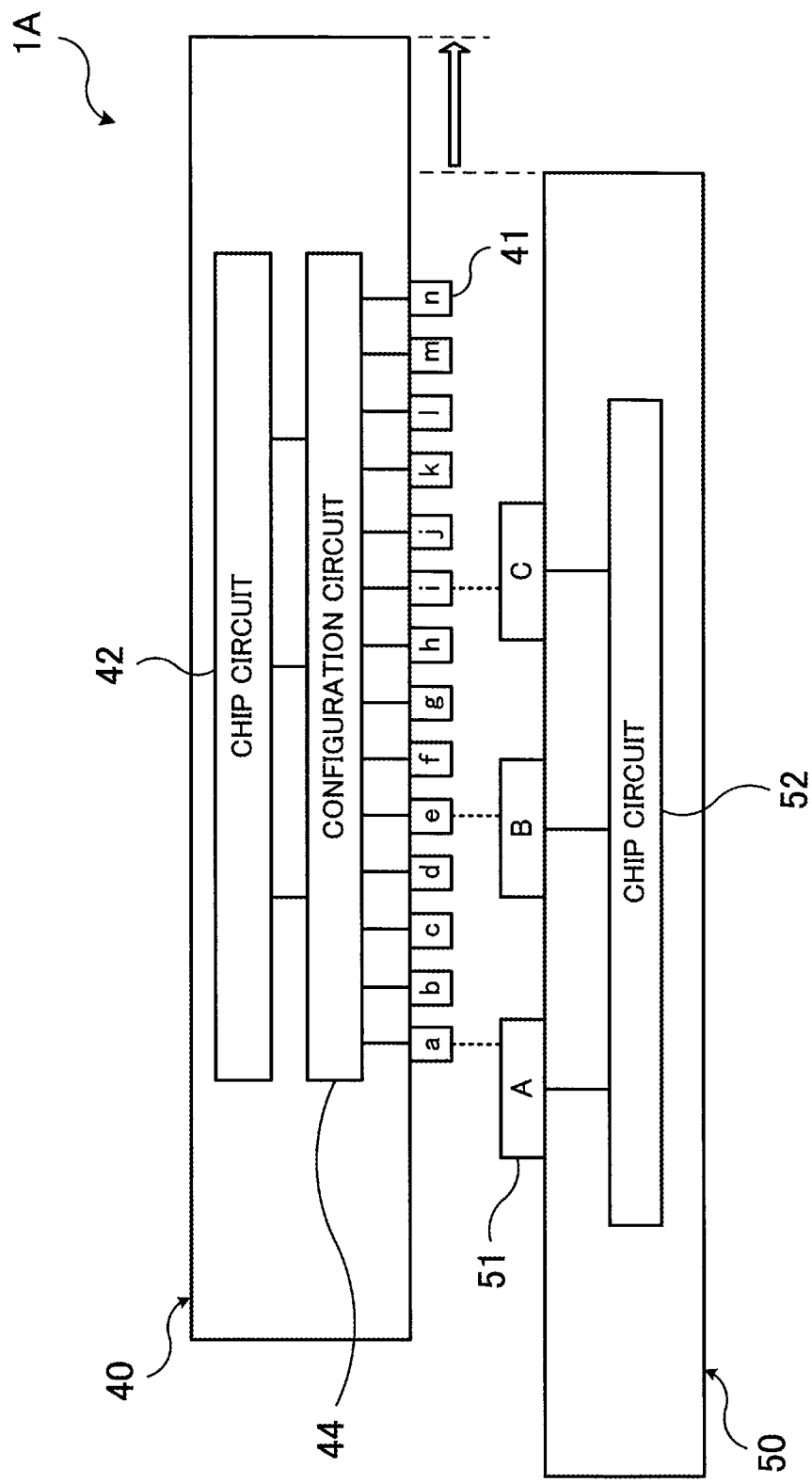
FIGS. 8 and 9 each illustrate an example of the electronic circuit device.
Figure 9:
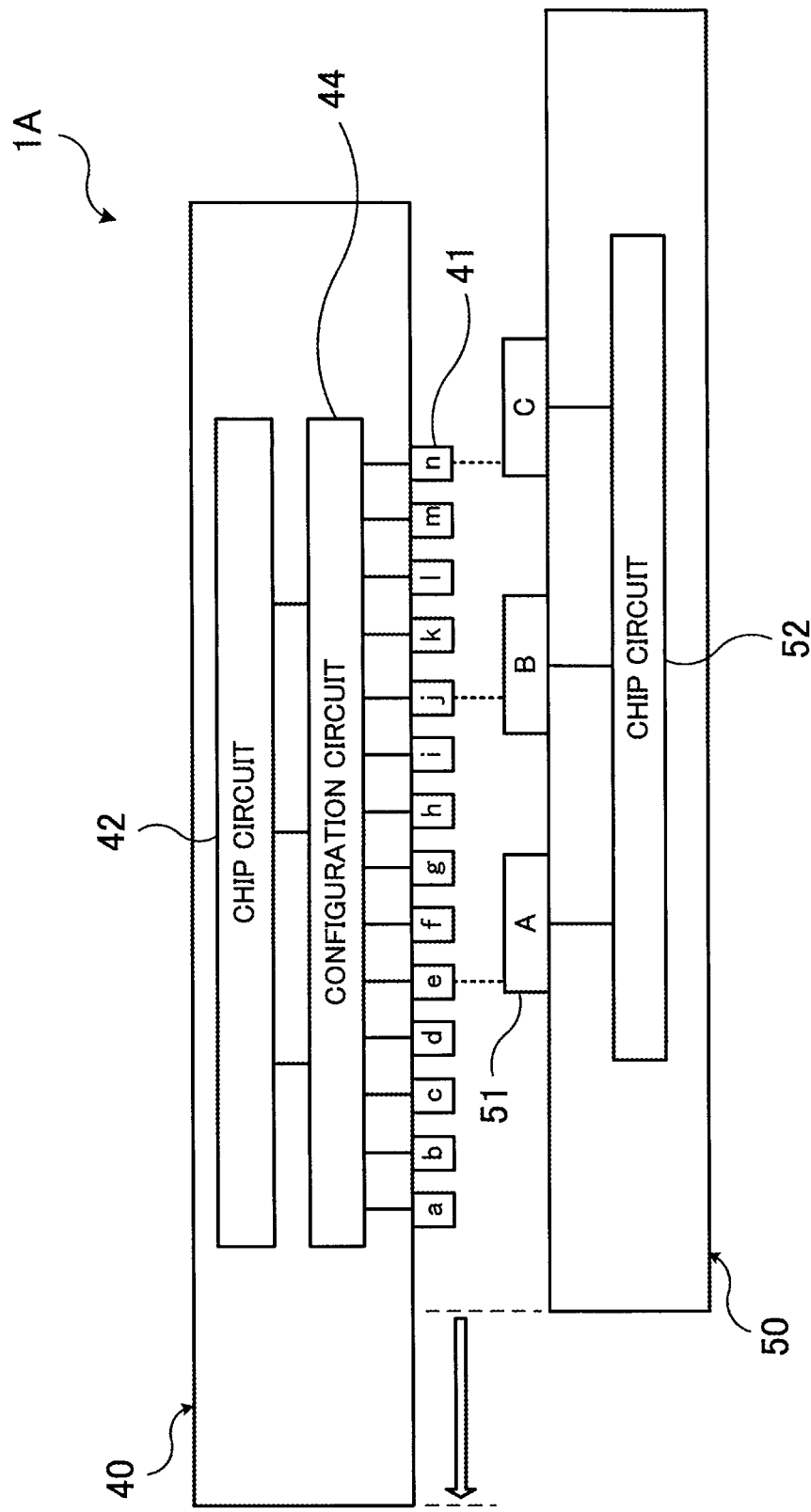

FIGS. 8 and 9 each illustrate an example of the electronic circuit device 1A obtained by applying the processing flow of FIG. 7 to the structure of FIG. 6. In this connection, in FIGS. 8 and 9, the set of upper terminals 41 is separate from the set of lower terminals 51 for illustrative purposes only.

With regard to the semiconductor chips 40 and 50 of FIG. 6, FIG. 8 illustrates an example where the upper semiconductor chip 40 is connected to the lower semiconductor chip 50 in a state of being shifted in a right direction (a thick arrow direction of FIG. 8).

In this case, when scanning is performed on the input pins IN of the multiplexer 44a1 (FIG. 6) connected to the terminals a to f (terminals 41), in order from an input pin IN connected to the terminal a, in accordance with he example of FIG. 7, the input pin IN connected to the terminal a is detected as an input pin IN connected to the terminal A (terminal 51). Similarly, when scanning is performed on the input pins IN of the multiplexer 44a2 (FIG. 6) connected to the terminals e to j (terminals 41), in order from an input pin IN connected to the terminal e, the input pin IN connected to the terminal e is detected as an input pin IN connected to the terminal B (terminal 51). Similarly, when scanning is performed on the input pins IN of the multiplexer 44a3 (FIG. 6) connected to the terminals i to n (terminals 41), in order from an input pin IN connected to the terminal i, the input pin IN connected to the terminal i is detected as an input pin IN connected to the terminal C (terminal 51).

As described above, in the electronic circuit device 1A obtained in the example of FIG. 8, the semiconductor chips 40 and 50 are connected in such a way that the terminal A and the terminal a are electrically connected, the terminal B and the terminal e are electrically connected, and the terminal C and the terminal i are electrically connected (as indicated by dotted lines).

With regard to the semiconductor chips 40 and 50 of FIG. 6, FIG. 9 illustrates an example where the upper semiconductor chip 40 is connected to the lower semiconductor chip 50 in a state of being shifted in a left direction (a thick arrow direction of FIG. 9).

In this case, when scanning is performed on the input pins IN of the multiplexer 44a1 (FIG. 6) connected to the terminals a to f (terminals 41), in order from an input pin IN connected to the terminal a, in accordance with the example of FIG. 7, the input pin IN connected to the terminal e is detected as an input pin IN connected to the terminal A (terminal 51). Similarly, when scanning is performed on the input pins IN of the multiplexer 44a2 (FIG. 6) connected to the terminals e to j (terminals 41), in order from an input pin IN connected to the terminal e, the input pin IN connected to the terminal j is detected as an input pin IN connected to the terminal B (terminal 51). Similarly, when scanning is performed on the input pins IN of the multiplexer 44a3 (FIG. 6) connected to the terminals i to n (terminals 41), in order from an input pin IN connected to the terminal i, the input pin IN connected to the terminal n is detected as an input pin IN connected to the terminal C (terminal 51).

As described above, in the electronic circuit device 1A obtained in the example of FIG. 9, the semiconductor chips 40 and 50 are connected in such a way that the terminal A and the terminal e are electrically connected, the terminal B and the terminal j are electrically connected, and the terminal C and the terminal n are electrically connected (as indicated by dotted lines).

In this connection, FIGS. 6 and 7 (and FIGS. 8 and 9) each illustrate an example where one terminal 41 that is detected first by scanning each of the multiplexer 44a1, 44a2, and 44a3 as a terminal electrically connected to a terminal 51 is set as an electrical connection destination. Alternatively, all terminals 41 that are electrically connected to each of the terminals 51 are detected, and some or all of the detected terminals 41 may be set as electrical connection destinations for the terminal 51.

In addition, here, the processing functions of the configuration circuit 44 are implemented by using the multiplexers 44a (44a1, 44a2, and 44a3), the memory circuit 44b, and the scan circuit 44c, but may be implemented by using a Field Programmable Gate Array (FPGA).

In the above semiconductor chips 40 and 50, what the terminals 41 and the terminals 51 have different plane sizes D4 and D5 is not essential, but what their pitches P4 and P5 are different is important. By disposing the set of terminals 41 at the narrow pitch P4 so as to leave some of the terminals 41 free, it is possible that each of the terminals 51 having the wide pitch P5 is connected to any of the terminals 41 if a positional misalignment G occurs between the upper semiconductor chip 40 and the lower semiconductor chip 50.

The constraints as described below are imposed on the pitch P4 of the terminals 41 of the semiconductor chip 40 and the pitch P5 of the terminals 51 of the semiconductor chip 50.

Figure 10:
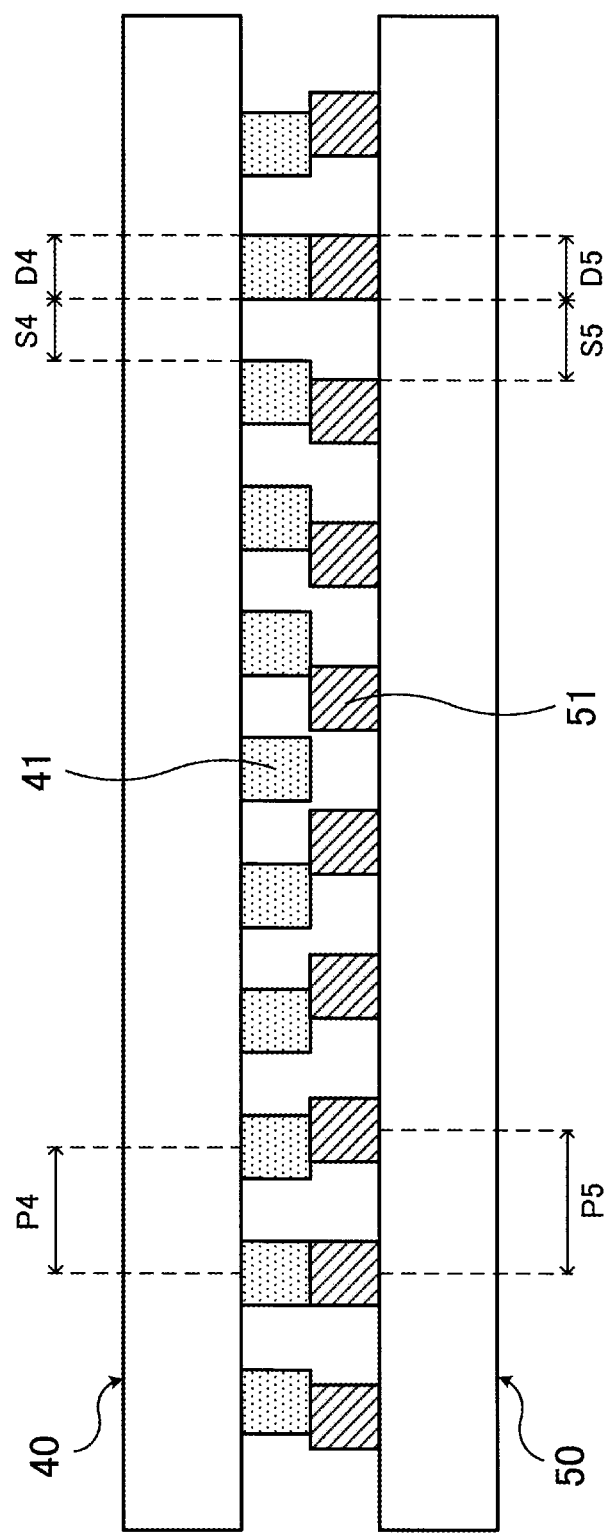
FIG. 10 is a view for explaining terminal pitches.

FIG. 10 is a view for explaining terminal pitches.

FIG. 10 illustrates an example where the set of upper terminals 41 and the set of lower terminals 51 have the same plane size D4 and D5 (for example, D4=D5=75 nm), and different spaces S4 and S5 (for example, S4=64 nm and S5=85 nm).

In a connection between the set of terminals 41 and the set of terminals 51, some of the terminals 41 having the narrow pitch P4 may be left free (open), but it is avoided that one of the terminals 41 having the narrow pitch P4 is connected to (that is, bridge) plural terminals 51 among the terminals 51. That is, the space S5 between the terminals 51 having the wide pitch P5 is set larger than the plane size D4 of the terminals 41 having the narrow pitch P4 (S5>D4).

In addition, in the connection between the set of terminals 41 and the set of terminals 51, each of the terminals 51 having the wide pitch P5 is connected to at least one of the terminals 41 having the narrow pitch P4, and it is avoided that any of the terminals 51 having the wide pitch P5 is left free. That is, the plane size D5 of the terminals 51 having the wide pitch P5 is set larger than the space S4 between the terminals 41 having the narrow pitch P4 (D5>S4).

In the case where these constraints of S5>D4 and D5>S4 are imposed on the set of terminals 41 and the set of terminals 51, a situation does not occur where any of the terminals 51 having the wide pitch P5 is connected to none of the terminals 41 having the narrow pitch P4. Note that it is preferable that the plane size D5 of the terminals 51 having the wide pitch P5 be large in order to increase the contact area between a terminal 41 and a terminal 51.

The following describes advantages provided by employing the above-described mechanism.

Figure 11:
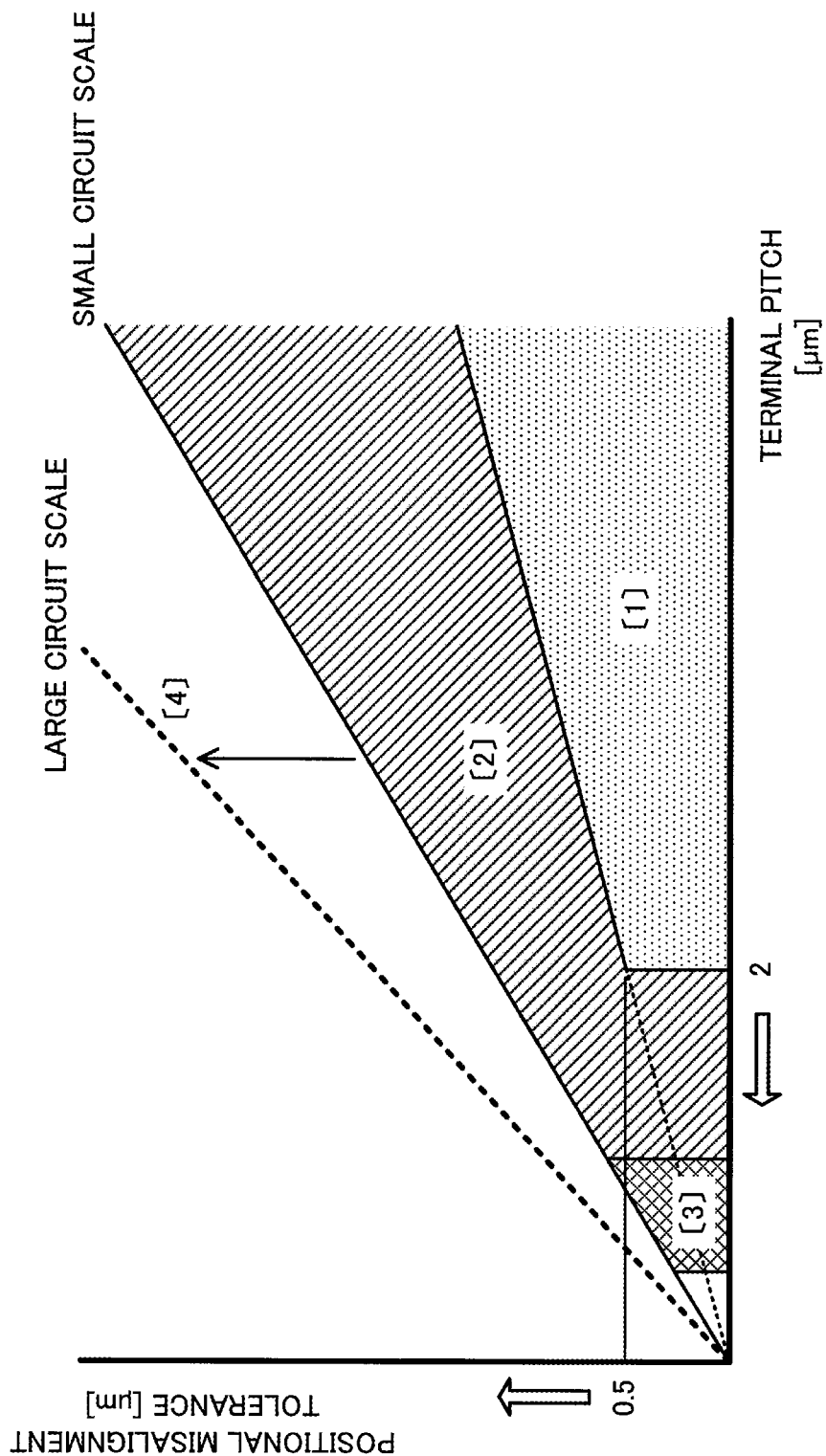
FIG. 11 is a view for explaining advantages.

FIG. 11 is a view for explaining advantages. FIG. 11 is a schematic view illustrating a relation between terminal pitch and positional misalignment tolerance.

An area [1] in FIG. 11 represents a relation between terminal pitch and positional misalignment tolerance in one-to-one connection between terminals according to a related art. If a positional misalignment of 0.5 μm is expected to occur in positional alignment, the terminal pitch needs to be set to at least several times the positional misalignment, for example, to 2 μm or longer.

An expanded area [2] in FIG. 11 represents a relation between terminal pitch and positional misalignment tolerance in the case where the sets of terminals having different pitches are physically connected and then electrical connection destinations are set as described above. Small-size terminals which are not usable in the related art become usable. In addition, even if terminals have the same pitch as those used in the related art, more positional misalignment, that is to say, positional misalignment several times the terminal pitch is tolerated. If it is possible to connect terminals having much narrower pitches and the above-described mechanism is employed, the area [2] of FIG. 11 may be expanded to include an area [3].

The angle of a hypotenuse of the area [2] representing the positional misalignment tolerance with respect to the terminal pitch is defined based on the circuit scale of the above-described configuration circuit. If the number of inputs in the configuration circuit increases, the positional misalignment tolerance is increased as illustrated in a dotted line [4] of FIG. 11.

According to the second embodiment, the electronic circuit device 1A obtained has an increased tolerance for positional misalignment between the semiconductor chips 40 and 50, reduces the occurrence of connection failure due to the positional misalignment, and provides superior performance and reliability.

A third embodiment will now be described.

Figure 12:
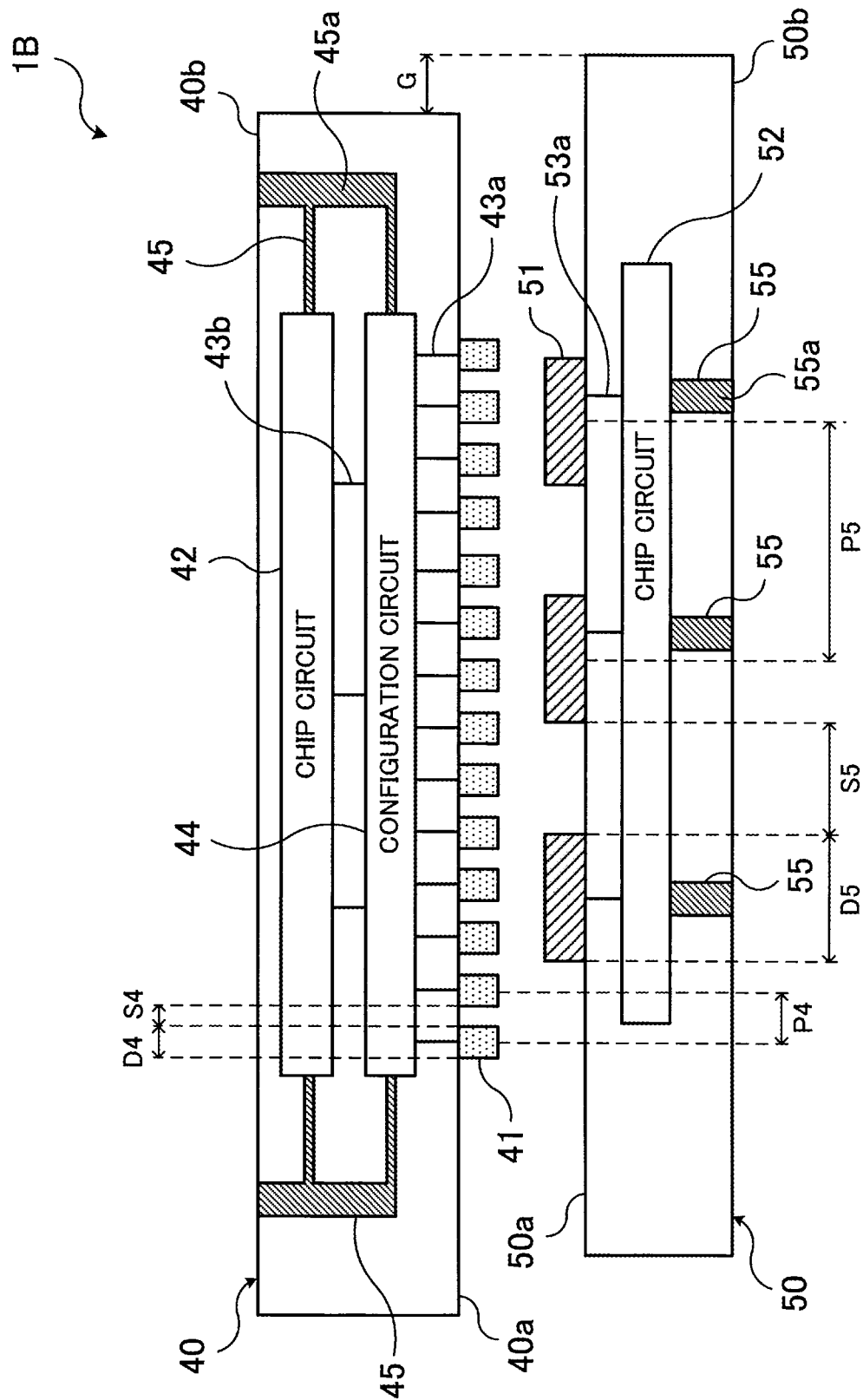
FIG. 12 illustrates an example of a structure of an electronic circuit device according to a third embodiment.

FIG. 12 illustrates an example of a structure of an electronic circuit device according to the third embodiment. In this connection, in FIG. 12, an upper electronic component is separate from a lower electronic component for illustrative purposes only.

The electronic circuit device 1B illustrated in FIG. 12 includes semiconductor chips 40 and 50 that are arranged to face each other vertically, as electronic components.

The upper semiconductor chip 40 includes a set of terminals 41 disposed on a surface 40a facing the semiconductor chip 50, a configuration circuit 44 electrically connected to each of the terminals 41 with a wire 43a, and a chip circuit 42 electrically connected to the configuration circuit 44 via a wire 43b. The terminals 41 have a plane size D4, a space S4, and a pitch P4.

The semiconductor chip 40 of the electronic circuit device 1B further includes conductors 45 drawn from the configuration circuit 44 and the chip circuit 42 to a surface 40b of the semiconductor chip 40 opposite the surface 40a having the terminals 41 disposed thereon. For example, a Through Silicon Via (TSV) 45a is used as each conductor 45. Electrical signals including signals, power supply signals, and GND signals are supplied from the outside of the semiconductor chip 40 to the internal configuration circuit 44 and the chip circuit 42 through the conductors 45.

The lower semiconductor chip 50 includes a set of terminals 51 disposed on a surface 50a facing the semiconductor chip 40, and a chip circuit 52 electrically connected to each of the terminals 51 with a wire 53a. The terminals 51 have a plane size D5, a space S5, and a pitch P5.

The semiconductor chip 50 of the electronic circuit device 1B further includes conductors 55 drawn from the chip circuit 52 to a surface 50b of the semiconductor chip 50 opposite the surface 50a having the terminals 51 disposed thereon. For example, a TSV 55a is used as each conductor 55. Electrical signals including signals, power supply signals, and GND signals are supplied from the outside of the semiconductor chip 50 to the internal chip circuit 52.

For example, in the electronic circuit device 1B, a Central Processing Unit (CPU) may be used as the lower semiconductor chip 50, and a memory chip may be used as the upper semiconductor chip 40. In addition, as the chip circuit 42 of the upper semiconductor chip 40, various kinds of circuits, such as a memory circuit and a vector product-sum operation circuit, may be used and for example, such various circuits may be incorporated in an FPGA. As the configuration circuit 44 of the upper semiconductor chip 40, a combination of a selector circuit, a memory circuit, and a scan circuit, or an FPGA providing processing functions equivalent to those of the combination may be used.

In the electronic circuit device 1B, the terminals 41 of one semiconductor chip 40 are formed smaller in plane size and space (D4<D5 and S4<S5) and narrower in pitch than the terminals 51 (P4<P5) than the terminals 51 of the other semiconductor chip 50, under prescribed constraints (S5>D4 and D5>S4). Thereby, if a positional misalignment G occurs in positional alignment that is performed in connecting the semiconductor chips 40 and 50, each of the terminals 51 having the comparatively wide pitch P5 is connected to at least one of the terminals 41 having the comparatively narrow pitch P4.

FIGS. 13A, 13B, and FIGS. 14A to 14C are views for explaining terminals of the electronic circuit device according to the third embodiment.

Figure 13A:
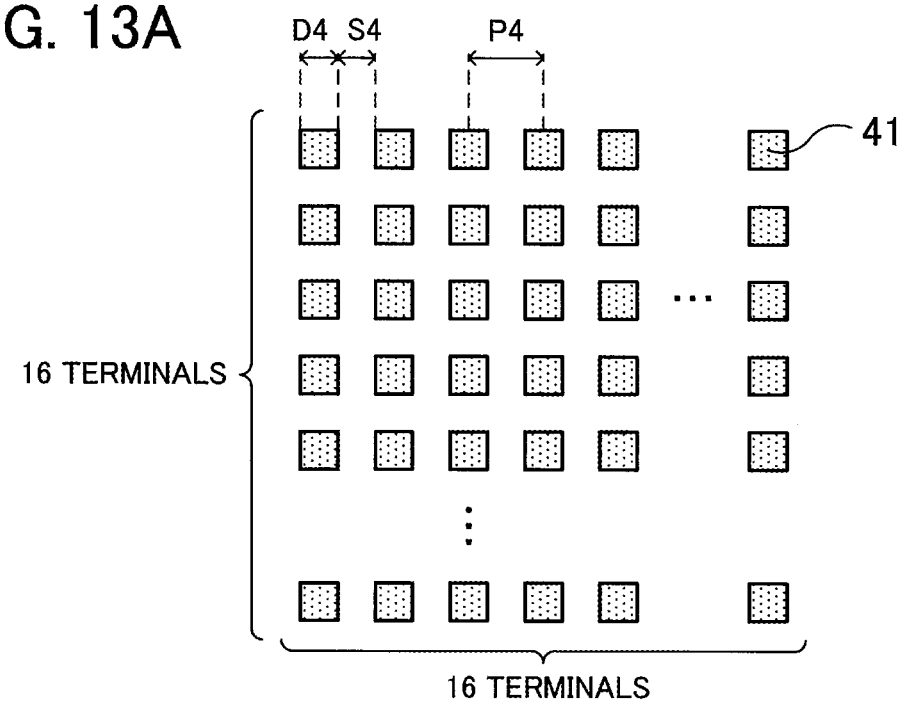
FIGS. 13A, 13B, and 14A to 14C are views for explaining terminals of the electronic circuit device according to the third embodiment.
Figure 13B:
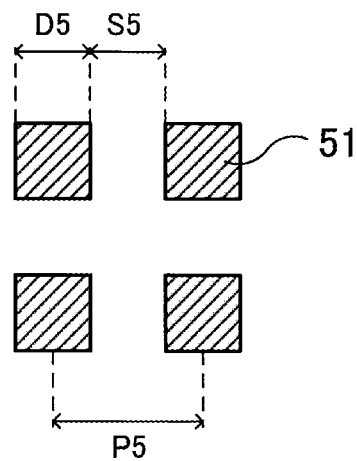
Figure 14A:
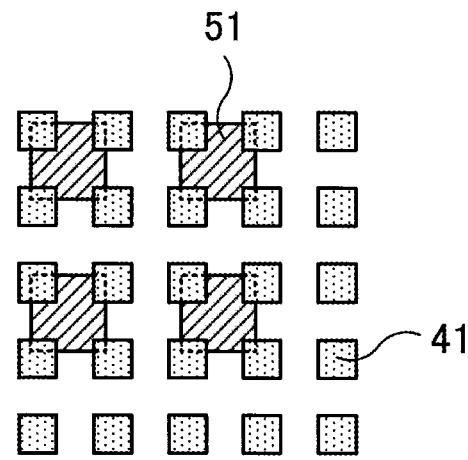
Figure 14B:
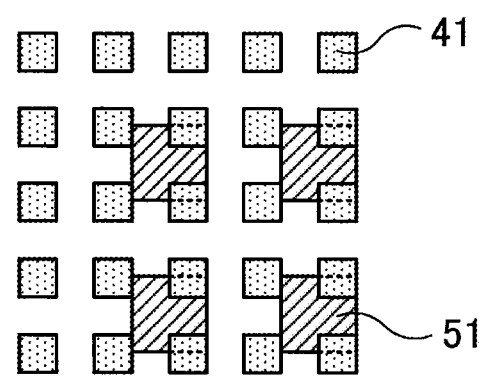
Figure 14C:
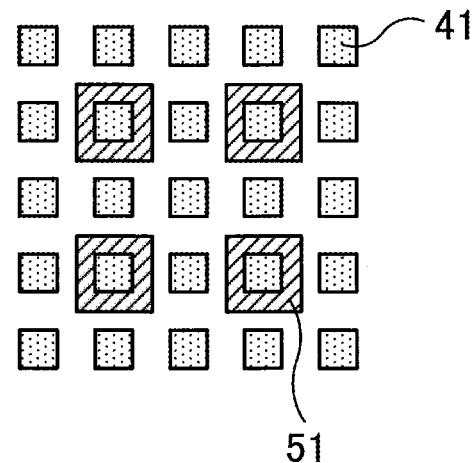

FIG. 13A illustrates an example of a plan layout for the set of terminals 41 disposed on the upper semiconductor chip 40, and FIG. 13B illustrates an example of a plan layout for the set of terminals 51 disposed on the lower semiconductor chip 50. FIGS. 14A to 14C each illustrate an example of an image of the set of terminals 41 and the set of terminals 51 that are laminated when the upper semiconductor chip 40 and the lower semiconductor chip 50 are connected to each other.

As an example, the terminals 41 of the upper semiconductor chip 40 illustrated in FIG. 13A have a plane size D4 of 75 nm, a space D4 of 75 nm, and a pitch P4 of 150 nm. As an example, the terminals 51 of the lower semiconductor chip 50 illustrated in FIG. 13B have a plane size D5 of 150 nm, a space S5 of 150 nm, and a pitch P5 of 300 nm. That is, the pitch P5 of the lower terminals 51 is twice the pitch P4 of the upper terminals 41.

For example, the pitch P4 of the terminals 41 of the semiconductor chip 40 is set different from the pitch P5 of the terminals 51 of the semiconductor chip 50, as illustrated in FIGS. 13A and 13B. In this case, even if a positional misalignment occurs in a plane direction between the semiconductor chips 40 and 50, each of the terminals 51 is connected to at least one of the terminals 41, as illustrated in FIGS. 14A to 14C, for example.

For example, in the case of the example of FIGS. 13A and 13B, a selector circuit may be built in the configuration circuit 44 such that a set of 16×16 terminals on the upper semiconductor chip 40 is connectable to the terminals 51 of the lower semiconductor chip 50. In this case, tolerance for positional misalignment between the semiconductor chips 40 and 50 is about 2.4 μm (150 nm×16). Using selector circuits each having 256 inputs and one output and 8-bit memory circuits, as many selector circuits as the number (about 300) of terminals 51 disposed on the lower semiconductor chip 50 may be provided in the upper semiconductor chip 40.

In the above-described electronic circuit device 1B, after the semiconductor chips 40 and 50 are physically connected to each other, one or more of the terminals 41 are set as electrical connection destinations for each of the terminals 51.

To this end, first, an electrical signal is supplied to the chip circuit 52 of the lower semiconductor chip 50 via the conductors 55, to set only one of the terminals 51 to H level (power supply level) and the remaining terminals 51 to High-Z state, for example. In this connection, in the semiconductor chip 50 of this type, the terminals 51 for power supply and GND are individually settable to the High-Z state at circuit level.

Then, an electrical signal is supplied to the chip circuit 42 and the configuration circuit 44 of the upper semiconductor chip 40 via the conductors 45, in order to set the selector circuit of the configuration circuit 44 to a scanning state. Thereby, the configuration circuit 44 scans the terminals 41 connected to the selector circuit, and detects one or more terminals 41 which are connected to the terminal 51 in H level and in connection with which an output from the selector circuit is H level. Information indicating the detected one or more terminals 41 is written in the memory circuit of the configuration circuit 44.

The above process is performed on each terminal 51 of the semiconductor chip 50 to set one or more terminals 41 as electrical connection destinations for the terminal 51.

The information indicating one or more terminals 41 as electrical connection destinations for each terminal 51, written in the memory circuit, is read when the electronic circuit device 1B actually operates, such as when the boot sequence begins. Then, the one or more terminals 41 indicated by the read information are connected to the chip circuit 42. By doing so, electrical signals are transferred between the semiconductor chip 50 and the semiconductor chip 40 via each combination of a terminal 51 and one or more terminals 41 indicated as its electrical connection destinations by the information.

In the electronic circuit device 1B, the set of terminals 41 and the set of terminals 51 are disposed at different pitches P4 and P5 under prescribed constraints. Even if a positional misalignment G occurs when the semiconductor chips 40 and 50 are physically connected to each other, each of the terminals 51 is connected to at least one of the terminals 41. After the semiconductor chips 40 and 50 are physically connected to each other, the configuration circuit 44 sets one or more of the terminals 41 as electrical connection destinations for each of the terminals 51. As a result, the electronic circuit device 1B obtained has an increased tolerance for positional misalignment between the semiconductor chips 40 and 50, reduces the occurrence of connection failure due to the positional misalignment, and provides superior performance and reliability.

A fourth embodiment will now be described.

Figure 15:
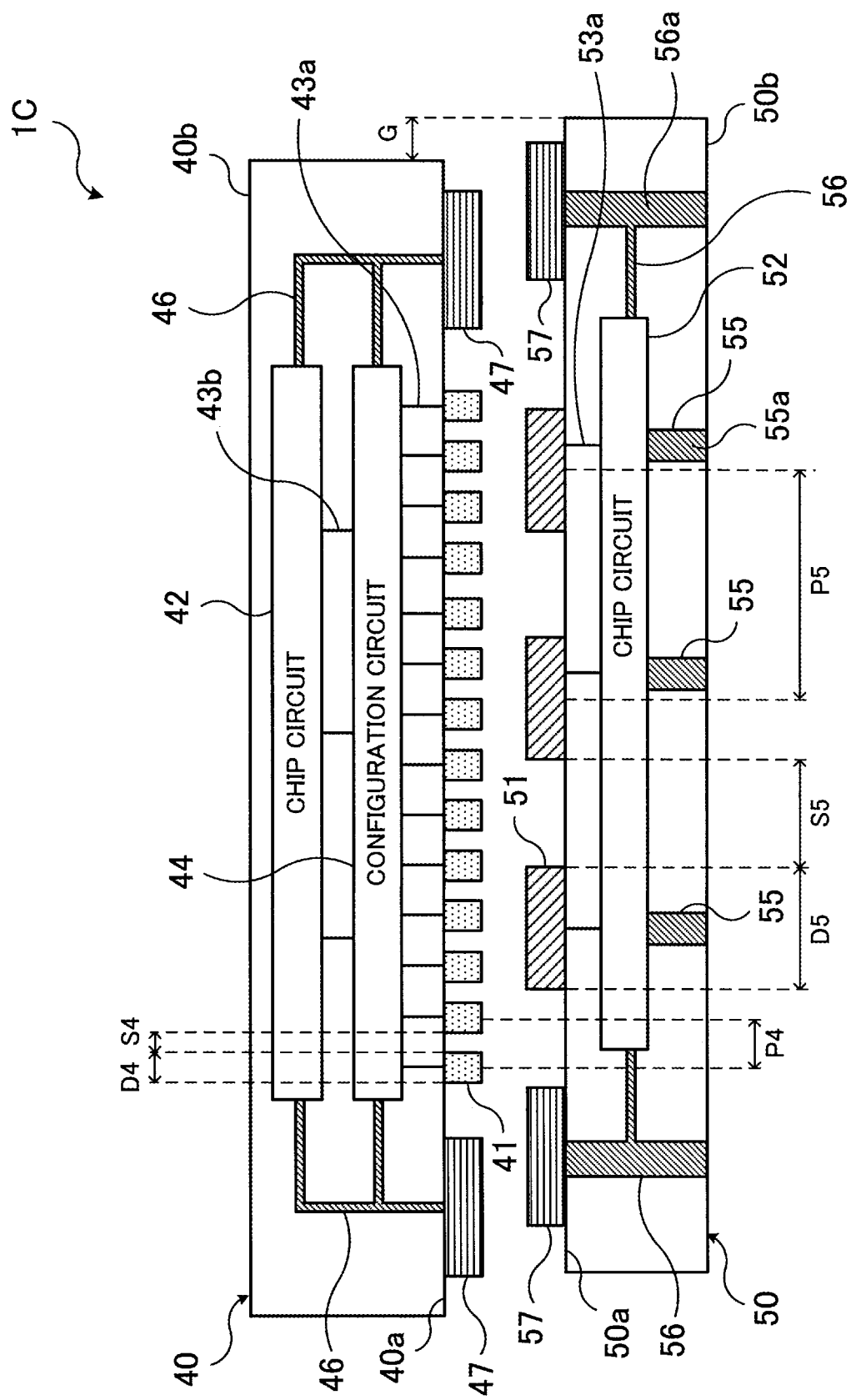
FIG. 15 illustrates an example of a structure of an electronic circuit device according to a fourth embodiment.

FIG. 15 illustrates an example of a structure of an electronic circuit device according to the fourth embodiment. In FIG. 15, an upper electronic component is separate from a lower electronic component for illustrative purposes only.

The electronic circuit device 1C illustrated in FIG. 15 includes semiconductor chips 40 and 50 that are arranged to face each other vertically, as electronic components.

The upper semiconductor chip 40 includes a set of terminals 41 disposed on a surface 40a facing the semiconductor chip 50, a configuration circuit 44 electrically connected to each of the terminals 41 via a wire 43a, and a chip circuit 42 electrically connected to the configuration circuit 44 with a wire 43b. The terminals 41 have a plane size D4, a space S4, and a pitch P4.

The semiconductor chip 40 of the electronic circuit device 1C further includes conductors 46 drawn from the configuration circuit 44 and the chip circuit to the surface 40a of the semiconductor chip 40 having the terminals 41 disposed thereon, and electrodes 47 that are formed on the surface 40a and are connected to the respective conductors 46. The electrodes 47 are larger in plane size than the terminals 41, and are formed outside a region where the terminals 41 to be configured are disposed.

The lower semiconductor chip 50 includes a set of terminals 51 disposed on a surface 50a facing the semiconductor chip 40, a chip circuit 52 electrically connected to each of the terminals 51 with a wire 53a, and conductors 55 drawn from the chip circuit 52 to a surface 50b opposite the surface 50a having the terminals 51 disposed thereon. The terminals 51 have a plane size D5, a space S5, and a pitch P5. For example, a TSV 55a is used as each conductor 55.

The semiconductor chip 50 of the electronic circuit device 1C further includes conductors 56 connected to the chip circuit 52, and electrodes 57 formed on the surface 50a and connected to the respective conductors 56. For example, a TSV 56a that penetrates the semiconductor chip 50 is used as each conductor 56. The electrodes 57 are larger in plane size than the terminals 51, and are formed outside a region where the terminals 51 are disposed, at positions corresponding to the positions of the electrodes 47 of the upper semiconductor chip 40.

In the electronic circuit device 1C, the electrodes 47 of the semiconductor chip 40 and the electrodes 57 of the semiconductor chip 50 have plane sizes such that each electrode 47 is at least partly connected to the corresponding electrode 57 (that is, such that the electrodes 47 and 57 overlap each other in a plan view) even if a positional misalignment occurs when the semiconductor chips 40 and 50 are physically connected to each other.

Electrical signals including signals, power supply signals, and GND signals are supplied to the configuration circuit 44 and chip circuit 42 of the semiconductor chip 40 via the conductors 56 and electrodes 57 of the semiconductor chip 50 and their respectively connected electrodes 47 and conductors 46. Electrical signals including signals, power supply signals, and GND signals are supplied to the chip circuit 52 of the semiconductor chip 50 via the conductors 55.

A CPU may be used as the lower semiconductor chip 50 of the electronic circuit device 1C, for example. Various kinds of circuits, such as a memory circuit and a vector product-sum operation circuit, may be used as the chip circuit 42 of the upper semiconductor chip 40, and for example, such various circuits may be incorporated in an FPGA. As the configuration circuit 44 of the upper semiconductor chip 40, a combination of a selector circuit, a memory circuit, and a scan circuit, or an FPGA providing the processing functions equivalent to those of the combination may be used.

In the electronic circuit device 1C, the terminals 41 of one semiconductor chip 40 are formed smaller in plane size and space (D4<D5 and S4<S5) and are narrower in pitch (P4<P5) than the terminals 51 of the other semiconductor chip 50, under prescribed constraints (S5>D4 and D5>S4). Since the terminals 41 and the terminals 51 are disposed at different pitches P4 and P5 under the prescribed constraints, each of the terminals 51 is connected to at least one of the terminals 41 if a positional misalignment G occurs when the semiconductor chips 40 and 50 are physically connected to each other. Then, after the semiconductor chips 40 and 50 are physically connected to each other, the configuration circuit 44 sets one or more of the terminals 41 as electrical connection destinations for each of the terminals 51, as in the above-described second and third embodiments. As a result, the electronic circuit device 1C obtained has an increased tolerance for positional misalignment between the semiconductor chips 40 and 50, reduces the occurrence of connection failure due to the positional misalignment, and provides superior performance and reliability.

A fifth embodiment will now be described.

FIGS. 16A, 16B, 17A, and 17B are views for explaining terminals of an electronic circuit device according to the fifth embodiment.

Figure 16A:
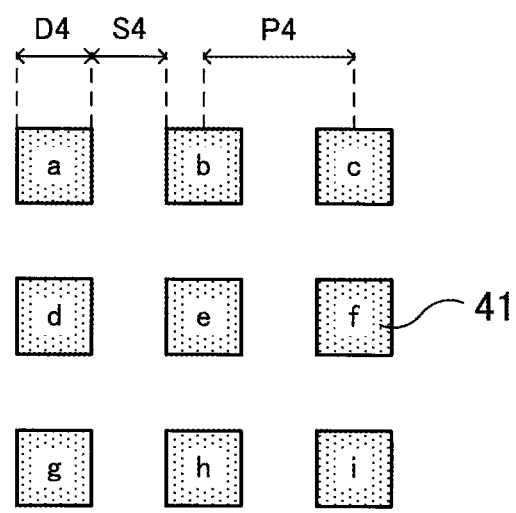
FIGS. 16A, 16B, 17A, and 17B are views for explaining terminals of an electronic circuit device according to a fifth embodiment.
Figure 16B:
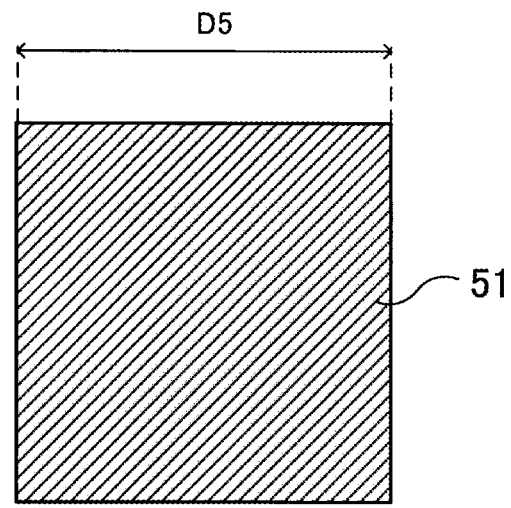
Figure 17A:
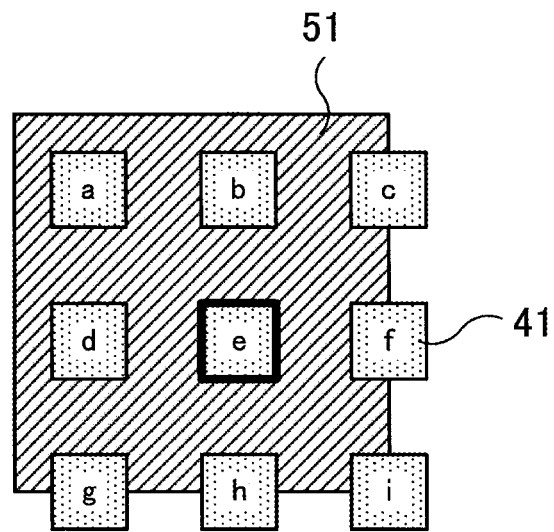
Figure 17B:
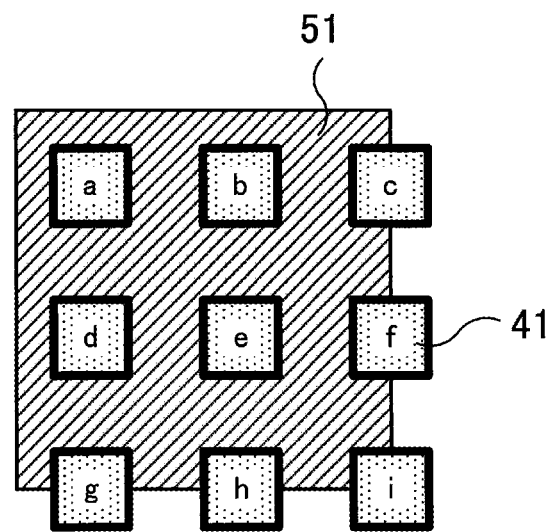

FIG. 16A illustrates an example of a plan layout of a set of terminals 41 disposed on an upper semiconductor chip 40, and FIG. 16B illustrates an example of a plan layout of a set of terminals 51 disposed on a lower semiconductor chip 50. FIGS. 17A and 17B each illustrate an example of an image of the set of terminals 41 and the set of terminals 51 that are laminated when the upper semiconductor chip 40 and the lower semiconductor chip 50 are connected to each other.

As an example, it is assumed that the terminals 41 of the upper semiconductor chip 40 illustrated in FIG. 16A have a plane size D4 of 75 nm and a space S4 of 75 nm. In addition, it is also assumed that the terminals 51 of the lower semiconductor chip 50 illustrated in FIG. 16B have a plane size D5 of 375 nm. That is to say, the plane size D5 of the lower terminals 51 is equivalent to a size covering 3×3 (horizontal×vertical) terminals 41. The plane size D5 of the lower terminals 51 is larger than twice the pitch P4 of the upper terminals 41, which enables one terminal 51 to be connected to a plurality of terminals 41.

In the case where one terminal 51 is connected to a plurality of terminals 41, there are two states as illustrated in FIGS. 17A and 17B: one is that a terminal 41 entirely overlaps the terminal 51 in a plan view (see terminals a, b, d, and e), and the other is that a terminal 41 partly overlaps the terminal 51 in a plan view (see terminals c, f, g, h, and i). In both states, the above-described configuration circuit 44 is able to detect an electrical connection of each terminal 41 to the terminal 51. In the case where the electrical connections of the plurality of terminals 41 to the terminal 51 are detected, the selection made by the selector circuit as to which of the terminals 41 is set as an electrical connection destination for the terminal affects the performance and reliability of the electronic circuit device.

In the case where the electrical connections of a plurality of terminals 41 to a terminal 51 are detected in this way, it is possible to set a terminal 41 that is the closest to the center among the terminals as an electrical connection destination for the terminal 51. For example, if electrical connections of the terminals a to i to the terminal 51 are detected as illustrated in FIG. 17A, the central terminal e (indicated by a thick line) among the terminals a to i is set as an electrical connection destination for the terminal 51. Since a terminal 41 closer to the center among the terminals 41 whose electrical connections to the terminal 51 are detected probably entirely overlaps the terminal 51 in a plan view, it is possible to ensure a contact area.

In addition, in the case where the electrical connections of the plurality of terminals 41 to the terminal 51 are detected, it is possible to set all of the terminals 41 as electrical connection destinations for the terminal 51. For example, as illustrated in FIG. 17B, in the case where electrical connections of the terminals a to i to the terminal 51 are detected, all of the terminals a to i (indicated by thick lines) are set as electrical connection destinations for the terminal 51. This increases the contact area between the terminal 51 and the terminals 41.

A sixth embodiment will now be described.

Figure 18:
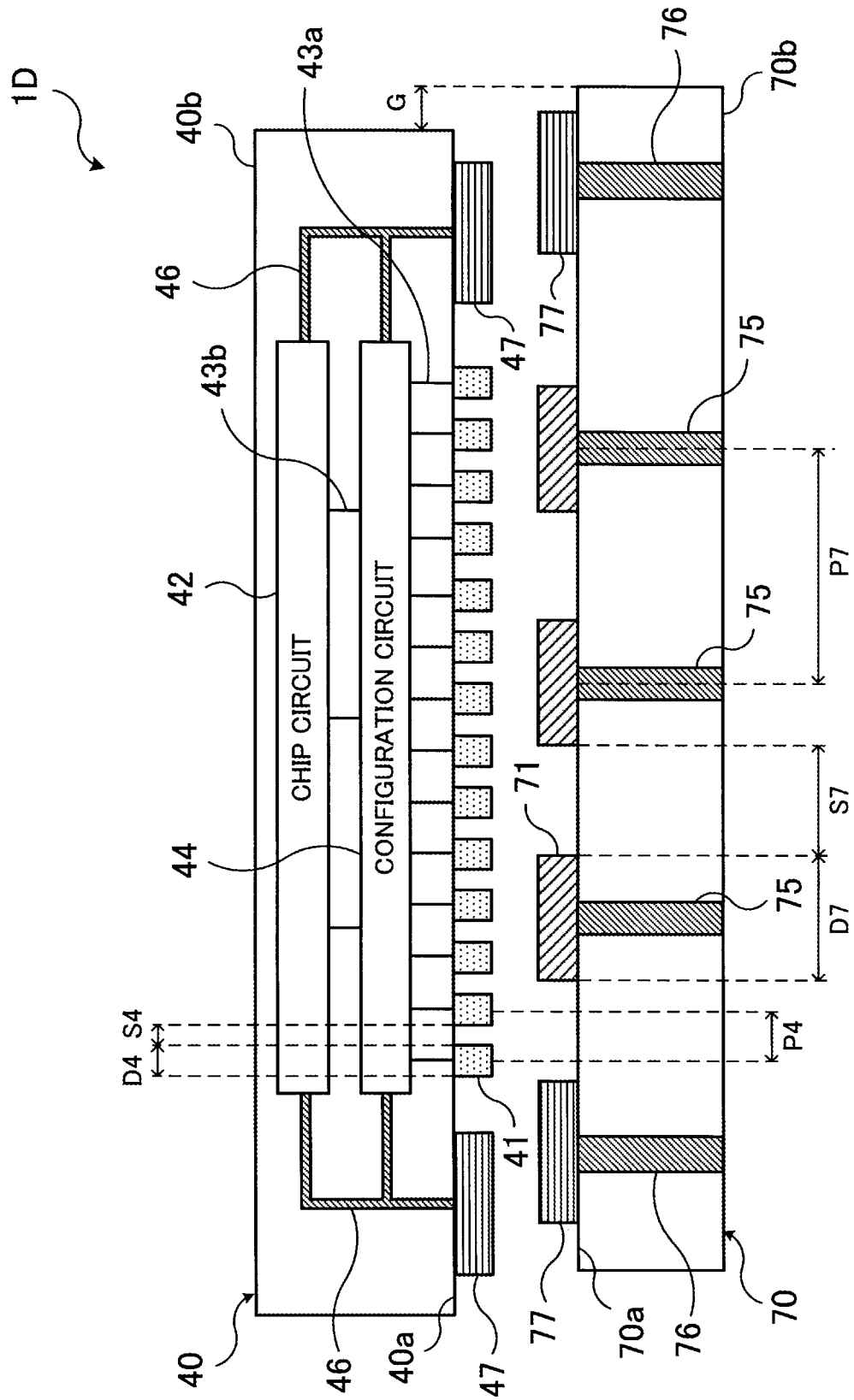
FIG. 18 illustrates an example of a structure of an electronic circuit device according to a sixth embodiment.

FIG. 18 illustrates an example of a structure of an electronic circuit device according to the sixth embodiment. In this connection, in FIG. 18, an upper electronic component is separate from a lower electronic component for illustrative purposes only.

The electronic circuit device 1D illustrated in FIG. 18 includes a semiconductor chip 40 and a circuit substrate 70 that are arranged to face each other vertically, as electronic components.

The upper semiconductor chip 40 has the same structure as described in the above-described fourth embodiment, for example. That is, the semiconductor chip includes a set of terminals 41, a configuration circuit 44 electrically connected to each of the terminals 41 with a wire 43$a$, and a chip circuit 42 electrically connected to the configuration circuit 44 with a wire 43$b$. The terminals 41 have a plane size D4, a space S4, and a pitch P4. The semiconductor chip 40 further includes conductors 46 drawn from the configuration circuit 44 and the chip circuit 42, and electrodes 47 that are connected to the respective conductors 46 and have a comparatively large area.

Various kinds of circuit substrates, such as a package substrate and an interposer, are used as the lower circuit substrate 70. The circuit substrate 70 includes a set of terminals 71 disposed on a surface 70$a$ facing the semiconductor chip 40, and conductors 75 electrically connected to the respective terminals 71. The conductors 75 are provided such as to conduct the surfaces 70$a$ and 70$b$ of the circuit substrate 70. The circuit substrate 70 further includes conductors 76, and electrodes 77 that are connected to the respective conductors 76 and have a comparatively large area. The conductors 76 are provided such as to conduct the surfaces 70$a$ and 70$b$ of the circuit substrate 70.

In the electronic circuit device 1D, the electrodes 47 of the semiconductor chip 40 and the electrodes 77 of the circuit substrate 70 have plane sizes such that each electrode 47 is at least partly connected to the corresponding electrode 77 (that is, such that the electrodes 47 and 77 overlap in a plan view) even if a positional misalignment occurs when the semiconductor chip 40 and the circuit substrate 70 are connected to each other.

Electrical signals including signals, power supply signals, and GND signals are supplied to the configuration circuit 44 and chip circuit 42 of the semiconductor chip 40 via the conductors 76 and electrodes 77 of the circuit substrate 70, and their respectively connected electrodes 47 and conductors 46.

The terminals 71 of the circuit substrate 70 have a plane size D7, a space S7 between adjacent terminals 71, and a pitch P7 (=D7/2+D7/2+S7) between adjacent terminals 71. The pitch P7 of the terminals 71 of the circuit substrate 70 is set wider than the pitch P4 of the terminals 41 of the semiconductor chip 40 (P4<P7).

In the electronic circuit device 1D, the terminals 41 of the semiconductor chip 40 are formed smaller in plane size and space (D4<D7 and S4<S7) and narrower in pitch (P4<P7) than the terminals 71 of the circuit substrate 70, under prescribed constraints (S7>D4 and D7>S4). The set of terminals 41 of the semiconductor chip 40 and the set of terminals 71 are disposed at different pitches P4 and P7 under the prescribed constraints. By doing so, each of the terminals 71 is connected to at least one of the terminals 41 if a positional misalignment G occurs when the semiconductor chip 40 and the circuit substrate 70 are physically connected to each other. Then, after the semiconductor chip 40 and the circuit substrate 70 are physically connected to each other, the configuration circuit 44 sets one or more of the terminals 41 as electrical connection destinations for each of the terminals 71, as in the above-described second and third embodiments. As a result, the electronic circuit device 1D obtained has an increased tolerance for positional misalignment between the semiconductor chip 40 and the circuit substrate 70, reduces the occurrence of connection failure due to the positional misalignment, and provides superior performance and reliability.

In the case where the semiconductor chip 40, which is an active circuit, is connected to the circuit substrate 70, which is a passive circuit, like the electronic circuit device 1D, it is possible to externally supply electrical signals to the terminals 71 of the circuit substrate 70 and the chip circuit 42 and configuration circuit 44 of the semiconductor chip 40. Therefore, the configuration circuit 44 is able to set one or more of the terminals 41 as electrical connection destinations for each of the terminals 71 accurately, and the electronic circuit device 1D is able to operate properly.

A seventh embodiment will now be described.

Figure 19:
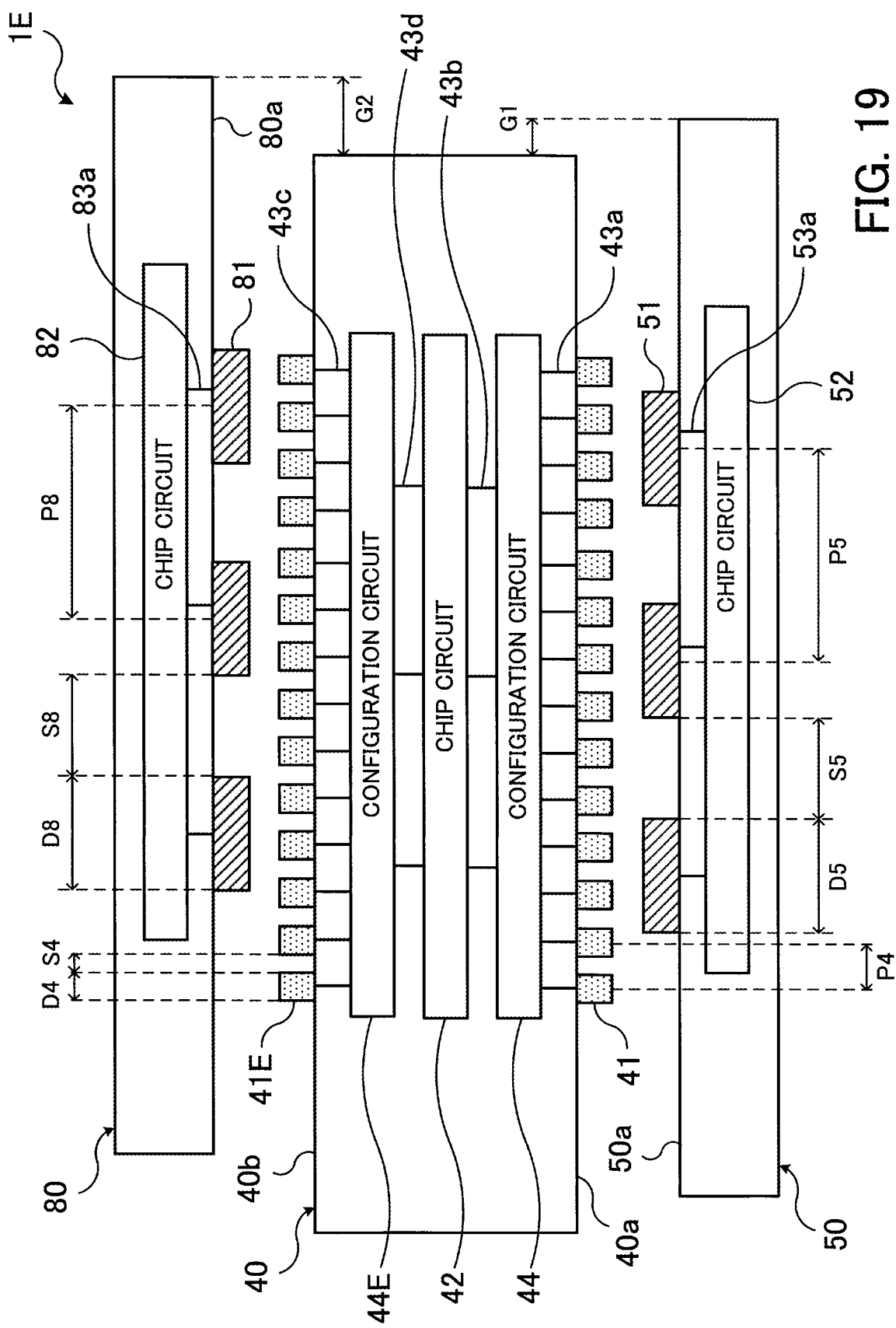
FIG. 19 illustrates an example of a structure of an electronic circuit device according to a seventh embodiment.

FIG. 19 illustrates an example of a structure of an electronic circuit device according to the seventh embodiment. In this connection, in FIG. 19, an upper electronic component is separate from a lower electronic component for illustrative purposes only.

The electronic circuit device 1E illustrated in FIG. 19 includes semiconductor chips 40, 50, and 80 (semiconductor elements) that are laminated vertically, as electronic components.

The semiconductor chip 40 of the electronic circuit device 1E includes a set of terminals 41 disposed on a surface 40a facing the semiconductor chip 50, a configuration circuit 44 electrically connected to each of the terminals 41 via a wire 43a, and a chip circuit 42 electrically connected to the configuration circuit 44 with a wire 43b. The terminals 41 have a plane size D4, a space S4, and a pitch P4.

The semiconductor chip 40 of the electronic circuit device 1E further includes a set of terminals 41E disposed on a surface 40b facing the semiconductor chip 80, a configuration circuit 44E electrically connected to each of the terminals 41E via a wire 43c, and a wire 43d electrically connecting the configuration circuit 44E and the chip circuit 42. For example, the terminals 41E have a plane size D4, a space S4, and a pitch P4, as in the terminals 41. The configuration circuit 44E has the same structure as the configuration circuit 44, and is designed to set one or more of the terminals 41E as electrical connection destinations for each terminal 81 of the semiconductor chip 80.

The semiconductor chip 50 of the electronic circuit device 1E includes a set of terminals 51 disposed on a surface 50a facing the semiconductor chip 40, and a chip circuit 52 electrically connected to each of the terminals 51 via a wire 53a. The terminals 51 have a plane size D5, a space S5, and a pitch P5. The terminals 51 of the semiconductor chip 50 are formed larger in plane size (D4<D5) and wider in pitch (P4<P5) than the terminals 41 of the semiconductor chip 40.

The semiconductor chip 80 of the electronic circuit device 1E includes a set of terminals 81 disposed on a surface 80a facing the semiconductor chip 40, and a chip circuit 82 electrically connected to each of the terminals 81 via a wire 83a. The terminals 81 have a plane size D8, a space S8, and a pitch P8. The terminals 81 of the semiconductor chip 80 are formed larger in plane size (D4<D8) and wider in pitch (P4<P8) than the terminals 41 of the semiconductor chip 40.

Although not illustrated here, conductors for external connection are formed in the semiconductor chips 40, 50, and 80 of the electronic circuit device 1E, as in the example of the above-described third or fourth embodiment. Electrical signals including signals, power supply signals, and GND signals are supplied to the configuration circuit 44, configuration circuit 44E, and chip circuit 42 of the semiconductor chip 40, the chip circuit 52 of the semiconductor chip 50, and the chip circuit 82 of the semiconductor chip 80 via the conductors.

In manufacturing the electronic circuit device 1E, the semiconductor chips 40 and 50 are arranged such that their surfaces 40a and 50a face each other, and then are subjected to positional alignment, heating, pressuring, and other processes, so that the terminals 41 and the terminals 51 are connected to each other. In addition, the semiconductor chips 40 and 80 are arranged such that their surfaces 40b and 80a face each other, and are subjected to positional alignment, heating, pressuring, and other processes, so that the terminals 41E and the terminals 81 are connected to each other.

In the electronic circuit device 1E, the terminals 41 of the semiconductor chip 40 are formed smaller in plane size and space (D4<D5 and S4<S5) and narrower in pitch (P4<P5) than the terminals 51 of the semiconductor chip 50 arranged under the semiconductor chip 40, under prescribed constraints (S5>D4 and D5>S4). Thereby, if a positional misalignment G1 occurs in positional alignment that is performed in connecting the semiconductor chips 40 and 50, each of the terminals 51 having the comparatively wide pitch P5 is connected to at least one of the terminals 41 having the comparatively narrow pitch P4.

Then, after the semiconductor chips 40 and 50 are physically connected to each other, the configuration circuit 44 detects one or more terminals that are electrically connected to each terminal 51 of the semiconductor chip 50. Information indicating the detected one or more terminals 41 is stored in the configuration circuit 44 (in a memory circuit thereof). In the manner described above, the one or more terminals are set as electrical connection destinations for each terminal 51 of the semiconductor chip 50. When the electronic circuit device 1E actually operates, the information stored in the configuration circuit 44 is used and the one or more terminals 41 indicated by the information are connected to the chip circuit 42.

In addition, in the electronic circuit device 1E, the terminals 41E of the semiconductor chip 40 are formed smaller in plane size and space (D4<D8 and S4<S8) and narrower in pitch (P4<P8) than the terminals 81 of the semiconductor chip 80 arranged above the semiconductor chip 40, under prescribed constraints (S8>D4 and D8>S4). Thereby, if a positional misalignment G2 occurs in positional alignment that is performed in connecting the semiconductor chips 40 and 80, each of the terminals 81 having the comparatively wide pitch P8 is connected to at least one of the terminals 41E having the comparatively narrow pitch P4.

Then, after the semiconductor chips 40 and 80 are physically connected to each other, the configuration circuit 44E detects one or more terminals 41E that are electrically connected to each terminal 81 of the semiconductor chip 80. Information indicating the detected one or more terminals 41E is stored in the configuration circuit 44E (in a memory circuit thereof). In the manner described above, the one or more terminals 41E are set as electrical connection destinations for each terminal 81 of the semiconductor chip 80. When the electronic circuit device 1E actually operates, the information stored in the configuration circuit 44E is used and the one or more terminals 41E indicated by the information are connected to the chip circuit 42.

As described above, in the electronic circuit device 1E, the set of terminals 41 and the set of terminals 51 are disposed at different pitches P4 and P5 under the prescribed constraints. If a positional misalignment G1 occurs when the semiconductor chips 40 and 50 are physical connected to each other, each of the terminals 51 is connected to at least one of the terminals 41. Then, after the semiconductor chips 40 and are physically connected to each other, the configuration circuit 44 sets one or more of the terminals 41 as electrical connection destinations for each of the terminals 51. In addition, the set of terminals 41E and the set of terminals 81 are disposed at different pitches P4 and P8 under the prescribed constraints. If a positional misalignment G2 occurs when the semiconductor chips 40 and 80 are physical connected to each other, each of the terminals 81 is connected to at least one of the terminals 41E. Then, after the semiconductor chips 40 and 80 are physically connected to each other, the configuration circuit 44E sets one or more of the terminals 41E as electrical connection destinations for each of the terminals 81. As a result, the electronic circuit device 1E obtained has an increased tolerance for positional misalignment between the semiconductor chips 40 and 50 and between the semiconductor chips 40 and 80, reduces the occurrence of connection failure due to the positional misalignment, and provides superior performance and reliability.

In this embodiment, the set of terminals 41E is disposed at the narrow pitch P4 on the surface 40b of the semiconductor chip 40, and the configuration circuit 44E is built in the semiconductor chip 40. Alternatively, a set of terminals may be disposed at a narrow pitch on the semiconductor chip 80 to be laminated on the semiconductor chip 40, and a configuration circuit may be built in the semiconductor chip 80.

Figure 20:
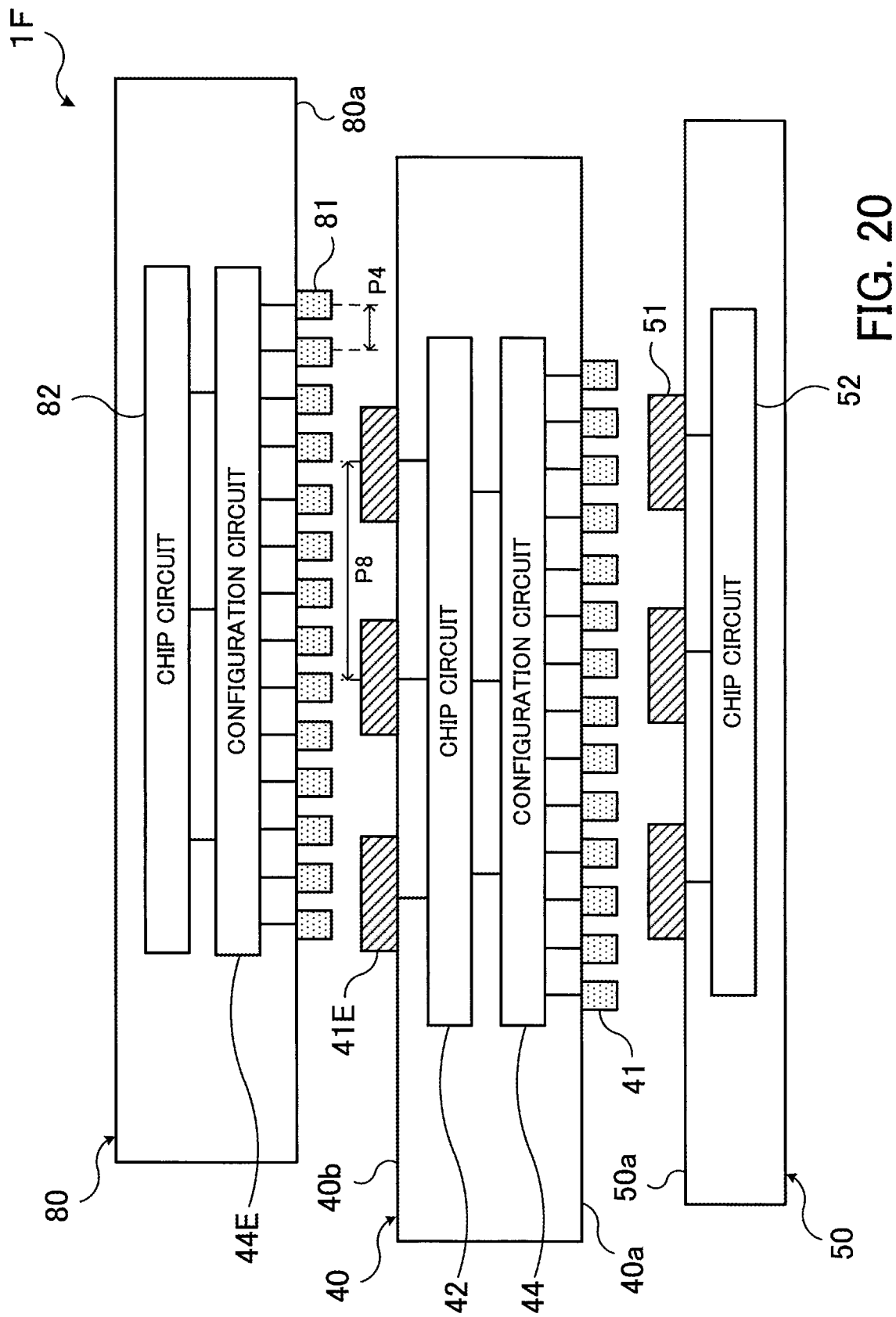
FIG. 20 illustrates another example of the structure of the electronic circuit device according to the seventh embodiment.

FIG. 20 illustrates another example of the structure of the electronic circuit device according to the seventh embodiment. In this connection, in FIG. 20, an upper electronic component is separate from a lower electronic component for illustrative purposes only.

In the electronic circuit device 1F illustrated in FIG. 20, a set of terminals 41E is disposed at a comparatively wide pitch P8 on a surface 40b of a semiconductor chip 40, and a set of terminals is disposed at a comparatively narrow pitch P4 on a surface 80a of a semiconductor chip 80. A configuration circuit 44E is built in the semiconductor chip 80. The electronic circuit device 1F has these different features from the above-described electronic circuit device 1E.

In the electronic circuit device 1F, the configuration circuit 44E built in the semiconductor chip 80 sets one or more of the terminals 81 of the semiconductor chip 80 as electrical connection destinations for each of the terminals 41E disposed on the surface 40b of the semiconductor chip 40.

With the above structure illustrated in FIG. 20, the electronic circuit device 1F obtained has an increased tolerance for positional misalignment between the semiconductor chips 40, 50, and 80, reduces the occurrence of connection failure due to the positional misalignment, and provides superior performance and reliability.

In this connection, this embodiment describes an example where three semiconductor chips 50, 40, and are laminated, but the number of chips to be laminated is not limited to three and four or more chips may be laminated.

In addition, in each of the electronic circuit devices 1E and 1F, the semiconductor chip 80 is laminated on the upper surface of the semiconductor chip 40, and the circuit substrate 70 as described in the sixth embodiment may be connected to the lower surface of the semiconductor chip 40, in place of the semiconductor chip 50.

An eighth embodiment will now be described.

The electronic circuit devices 1, 1A, 1B, 1C, 1D, 1E, and 1F described in the above first to seventh embodiments are installed in various kinds of electronic equipment. Examples of the electronic equipment include computers (personal computers, super computers, servers, and others), smartphones, portable telephones, tablet terminals, sensors, cameras, audio systems, measurement equipment, inspection equipment, and manufacturing equipment.

Figure 21:
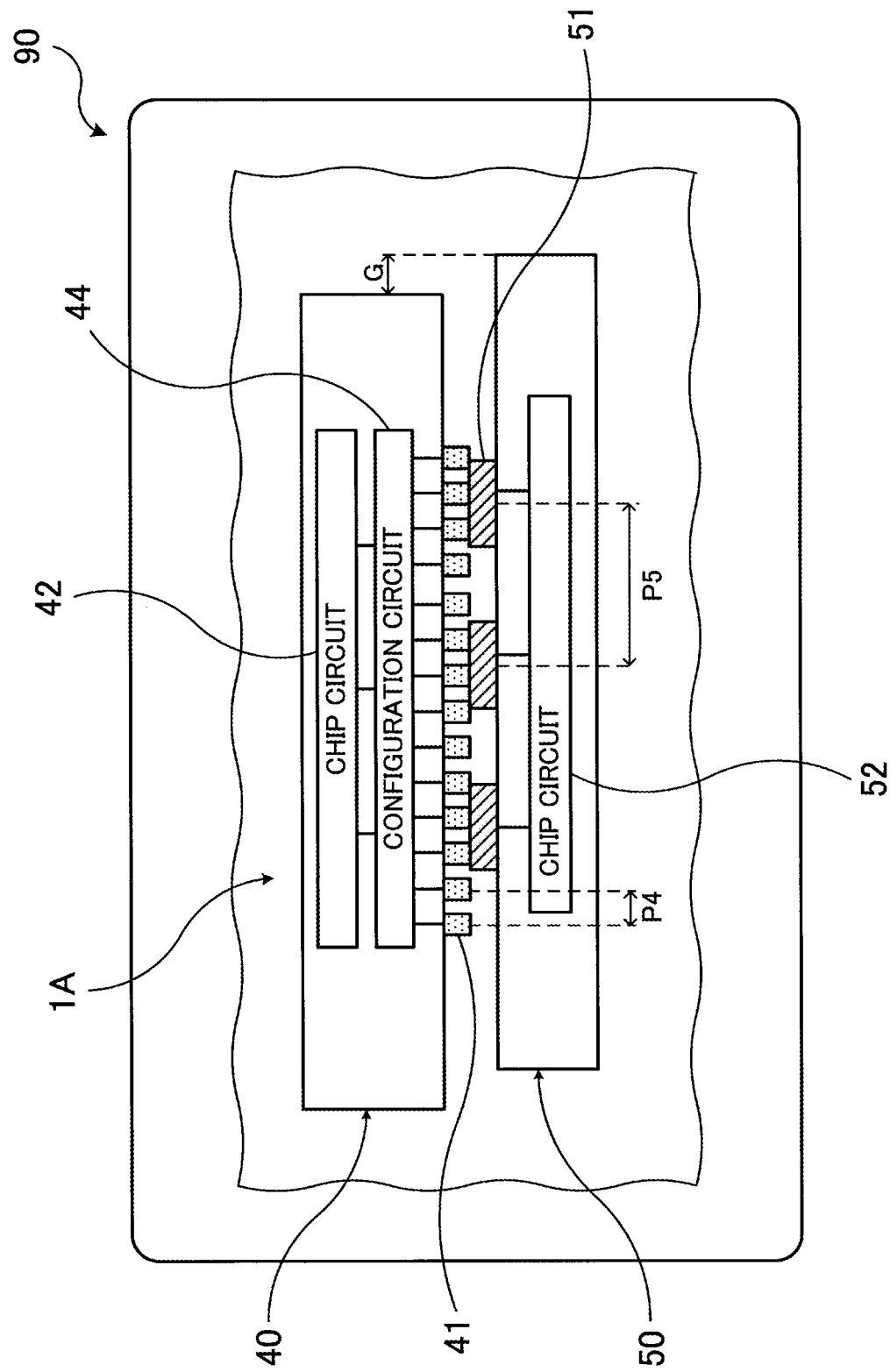
FIG. 21 is a view for explaining electronic equipment according to an eighth embodiment.

FIG. 21 is a view for explaining electronic equipment according to the eighth embodiment. FIG. 21 schematically illustrates an example of the electronic equipment.

As illustrated in FIG. 21, the electronic circuit device 1A (FIG. 4) described in the above second embodiment is mounted (installed) on a kind of electronic equipment 90. In the electronic circuit device 1A, the terminals 41 are disposed at a comparatively narrow pitch P4 on the semiconductor chip 40 and the terminals 51 are disposed at a comparatively wide pitch P5 on the semiconductor chip 50, under prescribed constraints, and these semiconductor chips 40 and 50 are physically connected to each other. If a positional misalignment G occurs when the semiconductor chips 40 and 50 are physically connected to each other, each of the terminals 51 having the comparatively wide pitch (wide pitch) P5 is connected to at least one of the terminals 41 having the comparatively narrow pitch (narrow pitch) P4. In the electronic circuit device 1A, after the semiconductor chips 40 and 50 are physically connected to each other, the configuration circuit 44 sets one or more of the terminals 41 as electrical connection destinations for each of the terminals 51. As a result, the electronic circuit device 1A obtained has an increased tolerance for positional misalignment between the semiconductor chips 40 and 50, reduces the occurrence of connection failure due to the positional misalignment, and provides superior performance and reliability. Accordingly, the electronic equipment 90 that includes the above electronic circuit device 1A provides superior performance and reliability.

This embodiment exemplifies the electronic equipment 90 on which the electronic circuit device 1A described in the above second embodiment is mounted. Likewise, the other electronic circuit devices 1, 1B, 1C, 1D, and 1F described in the above first and third to seventh embodiments may be mounted on various kinds of electronic equipment.

According to one aspect, it is possible to increase tolerance for positional misalignment between electronic components to be connected.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An electronic circuit device comprising:
   a first electronic component including a first circuit built in the first electronic component, a plurality of first terminals, and a first surface on which the plurality of first terminals is disposed at a first pitch, each of the plurality of first terminals being electrically connected to the first circuit; and
   a second electronic component including a plurality of second terminals, and a second surface on which the plurality of second terminals is disposed at a second pitch and which faces the first surface such that each of the plurality of second terminals opposes at least one of the plurality of first terminals disposed at the first pitch, the second pitch being larger than the first pitch, each of the plurality of second terminals disposed at the second pitch on the second surface being connected to at least one of the plurality of first terminals disposed at the first pitch on the first surface, wherein:
the plurality of first terminals on the first surface is disposed at the first pitch in a first direction and a second direction perpendicular to the first direction which are parallel to the second surface;
the plurality of second terminals on the second surface is disposed at the second pitch in the first direction and the second direction;
a distance between adjacent second terminals among the plurality of second terminals in the first direction is larger than a length of the plurality of first terminals in the first direction, and a distance between adjacent first terminals among the plurality of first terminals in the first direction is smaller than a length of the plurality of second terminals in the first direction;
a distance between adjacent second terminals among the plurality of second terminals in the second direction is lamer than a length of the plurality of first terminals in the second direction, and a distance between adjacent first terminals among the plurality of first terminals in the second direction is smaller than a length of the plurality of second terminals in the second direction;
the plurality of first terminals includes a third terminal and a fourth terminal; and
the third terminal is connected to any of the plurality of second terminals, and the fourth terminal is not connected to any of the second terminals.

2. The electronic circuit device according to claim 1, wherein the length of the plurality of first terminals in the first direction is smaller than the length of the plurality of second terminals in the first direction, and the length of the plurality of first terminals in the second direction is smaller than the length of the plurality of second terminals in the second direction.

3. The electronic circuit device according to claim 1, further comprising a second circuit built in the first electronic component and configured to detect a combination of one of the plurality of second terminals and at least one of the plurality of first terminals connected to the one second terminal.

4. The electronic circuit device according to claim 3, wherein the second circuit includes a memory configured to store information indicating the detected combination.

5. The electronic circuit device according to claim 4, wherein an electrical signal is transferred between the first electronic component and the second electronic component via the one second terminal and the at least one first terminal indicated as the combination in the information stored in the memory.

6. A method for manufacturing an electronic circuit device, the method comprising:
arranging a first electronic component including a first surface on which a plurality of first terminals is disposed at a first pitch and a second electronic component including a second surface on which a plurality of second terminals is disposed at a second pitch such that the first surface and the second surface face each other, the second surface facing the first surface such that each of the plurality of second terminals opposes at least one of the plurality of first terminals disposed at the first pitch, the first electronic component including a first circuit built in the first electronic component, each of the plurality of first terminals being electrically connected to the first circuit, the second pitch being larger than the first pitch; and
connecting each of the plurality of second terminals disposed at the second pitch on the second surface to at least one of the plurality of first terminals disposed at the first pitch on the first surface, wherein:
the plurality of first terminals on the first surface is disposed at the first pitch in a first direction and a second direction perpendicular to the first direction which are parallel to the second surface;
the plurality of second terminals on the second surface is disposed at the second pitch in the first direction and the second direction;
a distance between adjacent second terminals among the plurality of second terminals in the first direction is larger than a length of the plurality of first terminals in the first direction, and a distance between adjacent first terminals among the plurality of first terminals in the first direction is smaller than a length of the plurality of second terminals in the first direction;
a distance between adjacent second terminals among the plurality of second terminals in the second direction is lamer than a length of the plurality of first terminals in the second direction, and a distance between adjacent first terminals among the plurality of first terminals in the second direction is smaller than a length of the plurality of second terminals in the second direction;
the plurality of first terminals includes a third terminal and a fourth terminal; and
in the connecting, the third terminal is connected to any of the plurality of second terminals, and the fourth terminal is not connected to any of the second terminals.

7. The method according to claim 6, further comprising causing a second circuit built in the first electronic component to detect a combination of one of the plurality of second terminals and at least one of the plurality of first terminals connected to the one second terminal.

8. The method according to claim 7, further comprising storing information indicating the detected combination in a memory.

* * * * *